(12) United States Patent
Sugiyama et al.

(10) Patent No.: US 6,642,510 B1
(45) Date of Patent: Nov. 4, 2003

(54) PHOTOELECTRIC SWITCH DEVICE HAVING A DETECTION RESULT INDICATOR DISPOSED BETWEEN A TOP AND REAR WALL

(75) Inventors: Kazutoshi Sugiyama, Osaka (JP); Koji Fukumura, Osaka (JP)

(73) Assignee: Keyence Corporation, Osaka (JP)

( * ) Notice: Subject to any disclaimer, the term of this patent is extended or adjusted under 35 U.S.C. 154(b) by 76 days.

(21) Appl. No.: 09/635,710

(22) Filed: Aug. 9, 2000

(30) Foreign Application Priority Data

Jan. 14, 2000 (JP) .......................... 2000-007058
Jan. 21, 2000 (JP) .......................... 2000-012417

(51) Int. Cl.[7] .................... H01J 40/14; H01J 5/02
(52) U.S. Cl. .................... 250/239; 250/221; 340/555
(58) Field of Search ..................... 250/239, 221, 250/214 B, 559.29, 559.38; 340/555, 556; 356/615, 4.01

(56) References Cited

U.S. PATENT DOCUMENTS

| | | | | |
|---|---|---|---|---|
| 4,021,665 A | * | 5/1977 | Haas et al. ................. | 250/239 |
| 4,282,430 A | * | 8/1981 | Hatten et al. ............... | 250/221 |
| 5,255,301 A | * | 10/1993 | Nakamura et al. ........... | 377/6 |
| 5,281,810 A | | 1/1994 | Fooks et al. ............. | 250/222.1 |
| 5,336,882 A | | 8/1994 | Fooks et al. ................ | 250/221 |
| 5,347,117 A | | 9/1994 | Fooks et al. ................ | 250/221 |
| 5,712,477 A | | 1/1998 | Delaney, III et al. ....... | 250/221 |
| 5,808,296 A | * | 9/1998 | McMonagle et al. ....... | 250/221 |
| 6,157,040 A | * | 12/2000 | Bauer .................... | 250/559.38 |

FOREIGN PATENT DOCUMENTS

| | | | |
|---|---|---|---|
| DE | 297 07 451 U | 7/1997 | |
| JP | 56114780 | * | 9/1981 |
| JP | 9252242 | | 9/1997 |
| JP | 11126549 | * | 11/1999 |

OTHER PUBLICATIONS

"E3S–A/B", Best Control INSTs 14th Edition, Jul. 1998, pp. 118–149, No. SAOO–005, Omron Corporation, Tokyo, Japan.
"E3X–DA–N Series", OMRON, Nov. 1999, pp. 4–39, No. SCEA–137, Omron Corporation, Tokyo, Japan.
Toshitaka Nakajima, "Laser Range Finder DME Series", Factory Automation—Automatization and Labor–Saving of Factories, Oct. 1, 1996, pp. 48–51, vol. 41, No. 10, Japan Kogyo Publisher, Tokyo, Japan.

* cited by examiner

*Primary Examiner*—Que T. Le
*Assistant Examiner*—Eric Spears
(74) *Attorney, Agent, or Firm*—Smith Patent Office

(57) ABSTRACT

A photoelectric switch device for detecting an object within a field of detection on the basis of a position of the object is presented. The position is determined on the basis of a value relating to light that is reflected by the object. The photoelectric switch device has a light projecting and receiving optical arrangement disposed on a front wall of a box shaped casing, a display unit and a push type of adjusting switch disposed on a rear wall of the box shaped casing. The photoelectric switch device also has a push type of selecting fixing setting switch and an indicator disposed on one of walls of the box shaped casing, except the front and rear walls, and an output cable extending from a corner between the rear wall and another wall opposite to the one wall. The selecting fixing setting switch is used to select types of information that is to be displayed on the display unit in order to set and fix the value. The adjusting switch is used to adjust the value of information displayed on the display unit.

13 Claims, 17 Drawing Sheets

SELECTING/FIXING/SETTING SWITCH

SELECTING/FIXING/SETTING SWITCH

PHOTOELECTRIC SWITCH DEVICE HAVING A DETECTION RESULT INDICATOR DISPOSED BETWEEN A TOP AND REAR WALL

BACKGROUND OF THE INVENTION

1. Field of the Invention

The present invention relates to a photoelectric switch device for detecting an object in a specified region of detection.

2. Description of Related Art

Typically, various photoelectric switch devices are widely used to detect an object in a specified region of detection in, for example, a manufacturing line in a factory. Such a photoelectric switch device projects light rays toward a specific field of detection in which an object is expected to be present and detects an object in the specific region of detection on the basis of a value relating to light rays reflected by the object. A conventional triangulation method is used for some of this kind of photoelectric switch devices. The triangulation type photoelectric switch device is also referred to as a distance setting type of photoelectric switch device. Reference is made to FIGS. 25 through 27A to 27C which show the structure and operation of one of the conventional triangulation type photoelectric switch devices for the purpose of providing a brief background that will enhance an understanding of the present invention.

Referring to FIG. 25, a triangulation type photoelectric switch device 800 comprises a light emitting diode 801 as a light source, a projection lens 802, a focusing lens 803 and a photoelectric position sensing device (PSD) 804. The light emitting diode 801 is coaxially aligned with the optical axis Xp of projection lens 802. The projecting lens 802 and the focusing lens 803 are arranged with a specified separation in the same vertical plane including the optical axis Xp of the light projection lens 802. The light projecting lens 802 directs light rays emanating from the light emitting diode 801 toward an object 900 located remotely from the photoelectric switch device 800 in the optical axis Xp of the light projection lens 802. The light rays are then reflected back by the object 900 and focused on the photoelectric position sensing device 804 by the focusing lens 803 to form a light spot on the photoelectric position sensing device 804.

The position of the light spot Lp on the photoelectric position sensing device 804 varies according to the distance of the object 900 from the photoelectric switch device 800, and more particularly to the photoelectric position sensing device 804. This distance is hereafter referred as switch-to-object distance. Specifically, the light spot Lp is formed at one of opposite ends, for example, an end e1, of the photoelectric position sensing device 804 when the object 900 is at the closest switch-to-object distance of a specified field of detection D0 and shifts in position towards another end e2 of the photoelectric position sensing device 804 as the object 900 moves away from the photoelectric switch device 800, i.e. as the switch-to-object distance increases.

The photoelectric position sensing device 804 generates two position signals N and F having levels according to positions of the light spot Lp formed thereon. Specifically, the position signal N has a photoelectric signal (current) level proportional to the distance of the light spot Lp from the end e1 of the photoelectric position sensing device 804. The position signal F has a photoelectric signal (current) level proportional to the distance of the light spot Lp from the other end e2 of the photoelectric position sensing device 804. Accordingly, the switch-to-object distance of the object 900 is found on the basis of these two position signals N and F.

The photoelectric switch device 800 has a specified field of detection or axial detectable region of detection D0 that is defined between the closest axial position P1 and the remotest axial position P2 which are axial limit positions for light rays incident upon the photoelectric position sensing device 804 through the focusing lens 803. The axial detectable region of detection D0 is divided into two sub-regions on both sides of a specific axial position ST that is variably preset, namely a front half axial region DI that is on a side of the specific axial position ST close to the photoelectric switch device 800 and is used as an effective detection region and a rear half axial region D2 that is on a side remote from the photoelectric switch device 800 with respect to the specific axial position ST and is excluded from detection as an ineffective detection region.

The photoelectric switch device 800 is configured so as to detect an object 900 in the axial detectable region D0. However, the photoelectric switch device 800 determines that the object 900 is present within the effective detection region D1 only when light rays incident upon the photoelectric position sensing device 804 are from the object 900 positioned in the effective detection region D1.

Referring to FIGS. 26A and 26B showing a method of determining whether an object 900 is present within the effective detection region D1 on the basis of position signals N and F from the photoelectric position sensing device 804, a difference in level between N and F position signals (N−F) represents an axial position of the object 900 within the axial detectable region D0 and can be used as a position signal. In practice, the position signal is expressed as a ratio of the position signal level difference (N−F) relative to the total level of N and F position signals (N+F) for the purpose of normalization. The normalized position signal {(N−F)/(N+F)} is examined with respect to a threshold value TH, which meets with the position signal relating to the specific axial position ST, to determine whether an object 900 is present within the effective detection region D1. That is, it is determined that an object 900 is present within the effective detection region D1 when the position signal {(N−F)/(N+F)} is greater than the threshold value TH as shown in FIG. 26A or that an object 900 is not present within the effective detection region D1 but is within the ineffective detection region D2 when the position signal {(N−F)/(N+F)} is smaller than the threshold value TH as shown in FIG. 26B. The threshold value TH may be varied to shift the limit axial position ST so as to change, expand or narrow, the effective detection region D1 and the ineffective detection region D2.

FIGS. 27A to 27C illustrates a process of presetting a threshold value TH in the prior art photoelectric switch device 800. The prior art photoelectric switch 800 is provided with a threshold value trimming dial 810, a detection indicator lamp 811 and a detection stability indicator lamp 812. As shown in FIG. 27A, after putting an object 900 at a specified axial position in the optical axis Xp of the photoelectric switch device 800 and powering on the photoelectric switch device 800 to project light rays to the object 900, the threshold value trimming dial 810 is continuously turned clockwise until the detection indicator lamp 811 turns on. Then, the threshold value trimming dial 810 is set to a position indicated by a reference numeral "1". Subsequently, as shown in FIG. 27B, after removing the object 900 from the optical axis Xp which turns off the detection indicator lamp 811 and directs the light rays to a reflective reference object 901, the threshold value trimming dial 810 is further continuously turned clockwise until the detection indicator lamp 811 turns on again. The threshold value trimming dial 810 is set to a position indicated by a reference numeral "3". If there is no reflective reference object 901, the threshold value trimming dial 810 is turned clockwise until it reaches an extreme position. Finally, as shown in FIG. 27C, the threshold value trimming dial 810 is turned back counterclockwise to a midpoint, namely a position indicated by a reference numeral "2", between the positions "1" and "3". As a result, a specific axial position ST is set up at a position midway between the object 900 and the reference object 901. In other words, a threshold value TH meeting with the specific axial position ST is established. In this state, it is examined that both detection indicator lamp 811 and detection stability indicator lamp 812 turn on while there is an object 900 present in the field of detection and that, while the detection stability indicator lamp 812 turns on, the detection indicator lamp 811 turns off when the object 900 is removed from the field of detection. If the detection stability indicator lamp 811 does not turn on during the threshold value setting process, this indicates that there is only a small margin between the position of the object 900 and the specific axial position ST and/or between the specific axial position ST and the position of the reference object 901. After resetting the object 900, the same threshold value setup process shown in FIGS. 27A to 27C is repeated.

In the prior art photoelectric switch 800, it is too troublesome for the user to turn the threshold value trimming dial 810 while observing both detection indicator lamp 811 and detection stability indicator lamp 811 in order to set and adjust a threshold value. As a result, it is difficult to precisely recognize the axial position ST and in consequence to achieve a fine adjustment in the threshold value. Further, it is difficult to judge the margin between the position of the object 900 and the specific axial position ST as well as the margin between the specific axial position ST and the position of the reference object 901.

SAMMARY OF THE INVENTION

It is an object of the present invention to provide a photoelectric switch device in which a user can adjust and recognize a value relating to the processing of a photoelectric signal relating to light which is reflected by an object and representative of a position of the object, easily and accurately.

The foregoing object of the present invention is achieved by a photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls including at least first and second walls adjacent to each other and in which at least photoelectric means for receiving light reflected by an object in the field of detection and providing a photoelectric signal having a level according to a value relating to the light representative of a position of the object relative to the photoelectric means is installed; processing means for processing the photoelectric signal from the photoelectric means; display means disposed on one of the walls for changeably displaying a plurality of values relating to the processing of the photoelectric signal; adjusting means disposed on the first wall for adjusting the value displayed on the display means; and selection means disposed on the second wall for selecting a desired one of the values which is to be displayed on the display means.

The photoelectric signal is provided by received light after being reflected by an object in the field of detection and processed by the processing means. A plurality of values relating to the processing of the photoelectric signal can be changeably displayed on the display means.

The user can select a desired one of a plurality of the values that is to be displayed on the display means by the selecting means and adjust the value displayed on the display means by the adjusting means in the processing means. In this instance, the adjusting means and the selecting means are disposed on different walls of the box casing so that the user is prevented from making wrong operations of these means.

According to another aspect of the present invention, the photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls including at least first and second walls adjacent to each other and in which at least photoelectric means for receiving light reflected by an object in the field of detection and providing a photoelectric signal having a level according to a value relating to the light representative of a position of the object relative to the photoelectric means is disposed; processing means for processing the photoelectric signal from the photoelectric means; display means disposed on one of the walls for displaying an adjustable value relating to the processing of the photoelectric signal thereon and necessary to make a detection of the object within a specified region of acceptable positions in the field of detection; adjusting means disposed on the first wall for adjusting the adjustable value displayed on the display means; and fixing means disposed on the second wall for fixing the adjusted value as a value relating to the processing of the photoelectric signal.

The photoelectric signal is provided by received light after being reflected by an object and processed by the processing means. An adjustable value relating to the processing of the photoelectric signal, which is used to detect the object within a specified region of acceptable positions in the field of detection, is displayed on the display means. In this instance, the adjusting means and the selecting means are disposed on different walls of the box casing, so that the user is prevented from making wrong operations of these means. Furthermore, the user can adjust the value while viewing it on the display means, so that adjusting the value relating to the processing of the photoelectric signal is easy and precise and recognition of the adjusted value is easy.

The display means may changeably display a plurality of values involving the processing of the photoelectric signal thereon. In this instance, the user can easily recognize the values involving the processing of the photoelectric signal on the display.

According to another aspect of the invention, the photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls including at least first and second walls adjacent to each other and in which at least photoelectric means for receiving light reflected by an object in the field of detection and providing a photoelectric signal having a level according to a value relating to the light representative of a position of the object relative to the photoelectric means is installed; processing means for processing the photoelectric signal from the photoelectric means; setting means disposed on the second wall for setting an adjustable value that is provided as a result of the processing of the photoelectric signal and is used to make a detection of the object within a specified region of acceptable positions in the field of detection as a value involving the processing of the photoelectric signal; display means disposed on one of the walls for displaying the adjustable value set by the setting means thereon; and adjusting means disposed on the first wall for adjusting the value displayed on the display means in the processing means.

With this photoelectric switch device, the photoelectric signal is provided br received after being reflected by an object and processed by the processing means. An adjustable value relating to the processing of the photoelectric signal, which is used to detect the object within a specified region of acceptable positions in the field of detection, is displayed on the display means. In this instance, the adjusting means and the selecting means are disposed on different walls of the box casing, so that the user is prevented from making wrong operations of these means. The user can set an adjustable value, that is provided from the processing of the photoelectric signal and used to detect the object within a specified region of acceptable positions in the field of detection as a value involving the processing of the photoelectric signal by the setting means. The adjustable value that is set up is displayed on the display means, so that the user can adjust the value displayed on the display means. Because the adjusting means and the setting means are disposed on different walls of the box casing, the user is prevented from making wrong operations of these means. Furthermore, the user can adjust the adjustable value while viewing it on the display means, so that adjusting the adjustable value relating to the processing of the photoelectric signal is easy and precise and recognition of the adjusted value is simple.

The display means may changeably display a plurality of values involving the processing of the photoelectric signal thereon. In this instance, the user can easily recognize the plurality of values involving the processing of the photoelectric signal on the display. Further, the display means may be disposed on the first wall and displays the adjustable value wxpressed in figures. In this instance, the display means is disposed on the wall on which the adjusting means is disposed. Therefore, the user can adjust the adjustable value while viewing it on the display means, so that adjusting the adjustable value relating to the processing of the photoelectric signal is easier and precise and recognition of the adjusted value is also easier.

The processing means installed within the generally rectangular-parallelepiped box detects an object within a specified region of acceptable positions in the field of detection and transmits a data signal representative of a result of the detection to an external instrument through a output cable which extends out from the generally rectangular-parallelepiped box casing through one of the walls other than the second wall. In this instance, the data signal representative of the result of the detection is transmitted to the external instrument through the output cable. Because the output cable extends from a wall different from the wall on which the selecting means, fixing means or setting means is disposed, a large-sized selecting means, fixing means or setting means can be employed and, furthermore, the output cable does not interfere with operation of the selecting means, fixing means or setting means. The wall from which the output cable extends out may be formed, for example, as a tapered wall at a corner between the first and the second wall. In this arrangement, the output cable does not interfere with operation of the selecting means, fixing means or setting means.

The photoelectric switch device may further comprise the indication means disposed on the second wall of the box casing to indicate information relating to the detection. Because the indication means is disposed on the wall on which the selecting means, fixing means or setting means is disposed, any of the selecting means, fixing means or setting means can be operated while viewing information relating to the detection on the display means.

According to another aspect of the invention, the photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls including at least first and second walls; photoelectric means disposed within the generally rectangular-parallelepiped box casing for receiving light reflected by an object in the field of detection to generate a photoelectric signal according to received conditions of the light; display means disposed on one of the walls for changeably displaying a plurality of values generated on the basis of the photoelectric signal; selecting means disposed on the second wall for selecting a desired one of the values that is to be displayed on the display means; and adjusting means disposed on the first wall for adjusting the selected value displayed on the display means.

The photoelectric signal is provided by received light after being reflected by an object in the field of detection. A plurality of values generated on the basis of the photoelectric signal are changeably displayed on the display means. The user can select a desired one of the values that is to be displayed and adjust the value displayed on the display means by the adjusting means. In this instance, the user can adjust the value while viewing it on the display means, so that adjusting the value displayed on the display means is easy and precise, and recognition of the adjusted value is simple.

According to another aspect of the invention, the photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls including at least first and second walls; photoelectric means disposed within the generally rectangular-parallelepiped box casing for receiving light reflected by an object in the field of detection to generate a photoelectric signal according to received conditions of the light; processing means for processing the photoelectric signal from the photoelectric means; memory means for storing data of values generated on the basis of the photoelectric signal by the processing means; display means disposed on one of the walls for displaying an adjustable value relating to the processing of the photoelectric signal thereon and necessary to make a detection of the object within a specified region of acceptable positions in the field of detection; adjusting means disposed on the first wall for adjusting the adjustable value displayed on the display means; and fixing means disposed on the second wall for fixing and entering the adjusted value as a reference value in the memory means.

The photoelectric signal is provided according to received light reflected by an object in the field of detection and processed by the processing means. Values generated by the processing means are stored in the memory means. An adjustable value relating to the processing of the photoelectric signal and necessary to make a detection of the object within a specified region of acceptable positions in the field of detection is displayed on the display means. The user can adjust the adjustable value displayed on the display means by the adjusting means and stores the adjusted value as a reference value in the memory means. In this instance, since the adjusting means and the selecting means are disposed on different walls of the box casing, the user is prevented from erroniously operating these means. Furthermore, the user can adjust the adjustable value while viewing it on the display means, so that adjusting the adjustable value relating to the processing of the photoelectric signal is easy and precise and recognition of the adjusted value is simple.

The display means is capable of changeably displaying a plurality of values generated on the basis of the photoelectric signal. Therefore, the user can easily recognize the values generated on the basis of the photoelectric signal. The photoelectric switch device may further comprise selecting means disposed on the second wall for selecting a desired one of the values that is to be displayed on the display means. In this arrangement, the user will easily be able to select a desired one of the values to be displayed on the display means. In particular, the selecting means is disposed on a wall different from the wall on which the adjusting means is disposed, as a result of which, the user is prevented from erroneously operating the selecting means and the adjusting means. The fixing means and the selecting means may comprise a single operative member. This is always desirable in order to miniaturize the box casing even when employing a large size of combined selecting/fixing member and to achieve improved operability.

According to another aspect of the present invention, the photoelectric switch device for detecting an object within a field of detection-on the basis of a position of the object which is found on the basis of values of light that is reflected by the object. The photoelectric switch device comprises a generally rectangular-parallelepiped box casing which is defined by a plurality of walls including at least first and second walls adjacent to each other and in which at least photoelectric means for receiving light reflected by an object in the field of detection to generate a photoelectric signal according to received conditions of the light is installed; processing means for processing the photoelectric signal from the photoelectric means; memory means for storing data of values generated on the basis of the photoelectric signal by the processing means; setting means disposed on the second wall for setting and entering an adjustable value that is generated from the processing of the photoelectric signal and used to make a detection of the object within a specified region of acceptable positions in the field of detection as a value involving the processing of the photoelectric signal; display means disposed on one of the walls for displaying the adjustable value stored in the memory means; and adjusting means disposed on the first wall for adjusting the adjustable value displayed on the display means.

The photoelectric signal is provided by received light after being reflected by an object in the field of detection and processed by the processing means. Values generated by the processing means are stored in the memory means. An adjustable value relating to the processing of the photoelectric signal and necessary to make a detection of the object within a specified region of acceptable positions in the field of detection can be stored as a reference value in the memory by the setting means. The user can adjust the adjustable value displayed on the display means by the adjusting means. In this instance, the adjusting means and the selecting means are disposed on different walls of the box casing, so that the user is prevented from erroneously operating these means. Furthermore, the user can adjust the adjustable value while viewing it on the display means, so that adjusting the reference value that is to be stored in the memory means is easy and precise and recognition of the reference value is simple.

The display means can easily be capable of changeably displaying a plurality of values generated on the basis of the photoelectric signal, so that the user can easily recognize the values generated on the basis of the photoelectric signal on the display means. The photoelectric switch device may further comprise selecting means disposed on the second wall for selecting a desired one of the values that is to be displayed on the display means. In this instance, the user can select a desired one of the values to be displayed on the display means. In particular, because the selecting means is disposed on a wall different from the wall on which the adjusting means is disposed, the user is prevented from erroneously operating the selecting means and the adjusting means. The fixing means and the selecting means may be comprised into a single operative member, which is always desirable to miniaturize the box casing even when employing a large size of combined selecting/fixing member and to achieve improved operability.

Further, the display means is disposed on the first wall on which the adjusting means is disposed, so that the user can easily and precisely adjust the value while viewing it on the display means and recognition of the adjusted value is also easer.

The photoelectric switch device may further comprise light receiving means disposed on a third wall, other than the first and the second wall, for directing the light to the photoelectric means. In this instance, the adjusting means, selecting means or fixing means is disposed on a wall different from the wall on which the light receiving means, so that the box casing is miniaturized even when employing a large size of selecting means, fixing means or adjusting means and improved operability is achieved.

According to another aspect of the present invention, the photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls in which at least photoelectric for receiving light reflected by an object in the field of detection to generate a photoelectric signal according to received conditions of the light means is installed; processing means for processing the photoelectric signal from the photoelectric means; display means disposed on a first wall of the walls for displaying a value relating to the processing of the photoelectric signal; adjusting means disposed on the first wall of the generally rectangular-parallelepiped box casing for adjusting the adjustable value displayed on the display means in the processing means; and shielding means disposed between the first wall of the generally rectangular-parallelepiped box casing and the adjusting means for shielding an interior of the generally rectangular-parallelepiped box casing from ambient light and air.

The photoelectric switch device may further comprise selecting means disposed on a second wall for selecting one of a plurality of values relating to the processing of the photoelectric signal that is displayed on the display means, light source means for generating light installed in the generally rectangular-parallelepiped box casing, and optical means disposed on a third wall for directing the light toward the field of detection and directing light reflected from the field of detection toward the photoelectric means. The shielding means preferably comprises an annular ring member having an integral elastic thin wall member. The wall functions to unit the push button to the annular ring member into one member. The adjust means may comprise a push button disposed in a hole formed in one wall of the box casing.

The photoelectric signal is provided by received light after being reflected by an object in the field of detection and processed by the processing means. Values related to the processing of the photoelectric signal are displayed on the display means so the user can adjust an adjustable value displayed on the display means using the adjusting means. The display means and the adjusting means are disposed on the same wall, so that the user can easily and precisely adjust the value relating to the processing of the photoelectric signal while viewing it on the display means and easily recognize the adjusted value. Furthermore, the shielding means is disposed between the box casing and the adjusting means, so as to help make the box casing air tight.

According to another aspect of the present invention, the photoelectric switch device for detecting an object within a field of detection on the basis of a position of the object which is found on the basis of values of light that is reflected by the object. The photoelectric switch device comprises a generally rectangular-parallelepiped box casing which is defined by a plurality of walls which includes at least first and second walls opposite to each other and in which photoelectric means for receiving light reflected by an object in the field of detection and providing a photoelectric signal having a level according to a value relating to the light representative of a position of the object relative to the photoelectric means is installed; optical means disposed on the first wall for directing light from the field of detection to the photoelectric means; processing means for processing the photoelectric signal from the photoelectric means; and display means disposed on the second wall for displaying values relating to the processing of the photoelectric signal.

The photoelectric signal is provided by received light after being reflected by an object in the field of detection and processed by the processing means. A value relating to the processing of the photoelectric signal is displayed on the display means. In this instance, the optical means and the display means are disposed on opposite walls of the box casing, so that, even though the box casing is miniaturized, sufficient areas for installation of the optical means and display means are certainly provided. In consequence, the user can easily and precisely recognize a value relating to the processing of the photoelectric signal while viewing the value. This ensures a high accuracy of detection of an object.

The photoelectric switch device may comprise adjusting means disposed on the second wall for adjusting the value that is displayed on the display means. Disposing the adjusting means and the display means on the same wall enables the user to easily and precisely adjust a value while viewing the value on the display means. The photoelectric switch device may comprise selection means disposed on one of the walls, except the first and the second wall, for selecting a desired one of the values that is to be displayed on the display means. In this instance, the display means changeably displays a plurality of values relating to the processing of the photoelectric signal. The user can select a desired one of the values relating to the processing of the photoelectric signal that is to be displayed on the display mean and adjust the value displayed on the display means through the processing means. In particular, the adjusting means and the selecting means are disposed on the same wall of the box casing, so that the user is prevented from erroneously operating these means.

The photoelectric switch device may further comprise adjusting means disposed on the second wall of the box casing for adjusting an adjustable value relating to the processing of the photoelectric signal and necessary in order to make a detection of the object within a specified region of acceptable positions in the field of detection that is displayed on the display means and fixing means disposed on one of the walls excepting the first and the second wall of the box casing for fixing the adjusted value as a value relating to the processing of the photoelectric signal. Since the adjustable value that is relating to the processing of the photoelectric signal and used to detect an object is displayed on the display means, the user can adjust the adjustable value displayed on the display means and fix the adjusted value as a value relating to the processing of the photoelectric signal. In particular, the adjusting means and the fixing means are disposed on the same wall of the box casing, so that the user is prevented from erroneously operating these means.

The photoelectric switch device may further comprise setting means disposed on one of the walls, except the first and the second wall, for setting up an adjustable value that is generated from the processing of the photoelectric signal and necessary to detect the object within a specified region of acceptable positions in the field of detection as a value relating to the processing of the photoelectric signal and adjusting means disposed on the second wall for adjusting the adjustable value that is set up by the setting means and displayed on the display means through the processing means. In this instance, the user can set up an adjustable value that is generated from the processing of the photoelectric signal and necessary for making a detection of the object within a specified region of acceptable positions in the field of detection as a value relating to the processing of the photoelectric signal. The adjustable value set up by the setting means is displayed on the display means, so that the user can adjust the adjustable value displayed on the display means. In particular, the adjusting means and the setting means are disposed on the same wall of the box casing, so that the user is prevented from erroneously operating these means.

The processing means processes the photoelectric signal to detect the object within a specified region of acceptable positions in the field of detection. The result of the detection is indicated by indication means disposed on one of the walls, except the first and the second wall. Disposing the indication means on the wall on which the selecting means, fixing means or setting means is located enables the user to operate the selecting means while viewing information relating the detection indicated by the indication means.

The photoelectric switch device may further comprise selection means disposed on the second wall for selecting a desired one of a plurality of values relating to the processing of the photoelectric signal that is to be displayed on the display means and adjusting means disposed on one of the walls, except the first and second wall, for adjusting an adjustable value that is to be displayed on the display means through the processing means. The display means is capable of displaying the values relating to the processing of the photoelectric signal. In this instance, the display means changeably displays a plurality of values relating to the processing of the photoelectric signal. The user can select a desired one of the values that is to be displayed on the display means and adjust the value on the display means through the processing means. In particular, the adjusting means and the selecting means are disposed on different walls of the box casing, so that the user is prevented from erroneously operating these means. Furthermore, the display means and the selecting means are disposed on the same wall of the box casing, so that the user is able to select a desired value that is to be displayed on the display means while viewing it on the display means, which is always desirable for precisely selecting a value.

The photoelectric switch device may further comprise adjusting means disposed on one of the walls, except the first and the second wall, of the box casing for adjusting an adjustable value relating to the processing of the photoelectric signal thereon and necessary for detecting an object within a specified region of, acceptable positions in the field of detection that is displayed on the display means and fixing means disposed on the second wall for fixing the adjusted value as a value relating to the processing of the photoelectric signal. In this instance, an adjustable value relating to the processing of the photoelectric signal thereon and necessary to make a detection of the object within a specified region of acceptable positions in the field of detection is displayed on the display means. The user can adjust the adjustable value displayed on the display means and fix the adjusted value as a value relating to the processing of the photoelectric signal.

The photoelectric switch device may further comprise setting means disposed on the second wall for setting an adjustable value generated from the processing of the photoelectric signal and necessary to make a detection of the object within a specified region of acceptable positions in the field of detection as a value relating to the processing of the photoelectric signal and adjusting means disposed on one of the walls, except the first and the second wall, for adjusting the adjustable value that is set up by the setting means and displayed on the display means. In this instance, the user can set up an adjustable value generated from the processing of the photoelectric signal and necessary to make a detection of the object within a specified region of acceptable positions in the field of detection as a value relating to the processing of the photoelectric signal. The adjustable value that is set up is displayed on the display means. The user can adjust the adjustable value displayed on the display means by the adjusting means. In particular, the adjusting means and the setting means are disposed on different walls of the box casing, so that the user is prevented from erroneously operating these means. Furthermore, the display means and the setting means are disposed on the same wall of the box casing, so that the user can set up a value while viewing it on the display means, which is always desirable for precisely setting the value.

The photoelectric switch device may further comprises light emitting means for emitting light and optical means disposed on the first wall for directing the light toward the specified field of detection. The light emitting means and the display means are disposed on different walls of the box casing, so that, even though the box casing is miniaturized, sufficient areas for installation of the optical means and display means are certainly provided.

According to still another aspect of the present invention, the photoelectric switch device for detecting an object within a field of detection on the basis of a position of the object which is found on the basis of values of light that is reflected by the object. The photoelectric switch device comprises a generally rectangular-parallelepiped box casing defined by a plurality of walls including at least first and second walls adjacent to each other; photoelectric means for receiving light reflected by an object in the field of detection and providing a photoelectric signal having a level according to a value relating to the light representative of a position of the object relative to the photoelectric means installed in the generally rectangular-parallelepiped box casing; optical means disposed on the first wall of the generally rectangular-parallelepiped box casing for directing the reflected light to the photoelectric element; and display means disposed on the second wall of the generally rectangular-parallelepiped box casing for displaying a value generated on the basis of the photoelectric signal. In this instance, light rays from the field of detection are directed to the photoelectric means through the optical means and transformed into a photoelectric signal. Values generated on the basis of the photoelectric signal are displayed on the display means. The optical means and the display means are disposed on opposite walls of the box casing, so that, even though the box casing is miniaturized, sufficient areas for installation of the optical means and display means can be still attained. In consequence, the user can easily and precisely recognize a value relating to the processing of the photoelectric signal while viewing the value. This ensurs high accuracy detection of an object.

The photoelectric switch device may further comprises adjusting means disposed on the second wall for adjusting a value that is to be displayed on the display means. Disposing the display means and the adjusting means on the same wall of the box casing enables the user to easily and precisely adjust a value while viewing the value on the display means. Therefore, the value can be easily and precisely recognized.

The photoelectric switch device may further comprises selecting means disposed on one of the walls, other than the first and the second wall, for selecting a desired one of a plurality of values generated on the basis of the photoelectric signal that is to be displayed on the display means. The display means is capable of changeably displaying the plurality of values thereon. In this instance, the display means changeably displays a plurality of values generated on the basis of the photoelectric signal. The user can select a desired one of the values that is to be displayed on the display means and adjust the value on the display means. In particular, the adjusting means and the selecting means are disposed on different walls of the box casing, so that the user is prevented from erroneously operating these means.

In addition, the photoelectric switch device may comprise processing means for processing the photoelectric signal from the photoelectric means, memory means for storing data of values generated through the processing means, and fixing means disposed on one of the walls, except the first and the second wall, for fixing and storing the adjusted value as a reference value in the memory. In this instance, values generated by the processing means are stored in the memory means. Thus, the user can adjust a value displayed on the display means by the adjusting means and stores the adjusted value as a reference value in the memory means by the fixing means. In particular, the adjusting means and the fixing means are disposed on different walls of the box casing, so that the user is prevented from erroneously operating these means.

The photoelectric switch device may further comprise setting means disposed on one of the walls, except the first and the second wall, for setting an adjustable value generated on the basis of the photoelectric signal and necessary to detect the object within a specified region of acceptable positions in the field of detection as a value relating to the processing of the photoelectric signal. The display means displays the adjustable value set up by the setting means. In this instance, the user can set up an adjustable value generated on the basis of the photoelectric signal and necessary to make a detection of the object within a specified region of acceptable positions in the field of detection as a value relating to the processing of the photoelectric signal. The adjusted value is displayed on the display means, so that the user can adjust the adjustable value while viewing it on the display means. In particular, the adjusting means and the setting means are disposed on different walls of the box casing, so that the user is prevented from erroneously operating these means.

The photoelectric switch device may further comprise processing means for processing the photoelectric signal from the photoelectric means, memory means for storing data of one of a plurality of values generated from the processing of the photoelectric signal that is set up by the setting means as a reference value and data of the reference value after adjustment by the adjusting means therein. In this instance, the photoelectric signal from the photoelectric means is processed by the processing means. A desired one of values generated from the processing of the photoelectric signal that is set up is stored as a reference value in the memory means. The reference value after adjustment by the adjusting means is also stored in the memory means.

BRIEF DESCRIPTION OF THE DRAWINGS

The foregoing and other objects and features of the present invention will be clearly understood from the following detailed description of preferred embodiments thereof when read in conjunction with the accompanying drawings in which:

FIGS. 27A to 27C are explanatory illustrations showing a process of setting a threshold level of a prior art triangulation type of photoelectric switch.

DETAILED DESCRIPTION OF THE PREFERRED EMBODIMENTS

Figure 1:
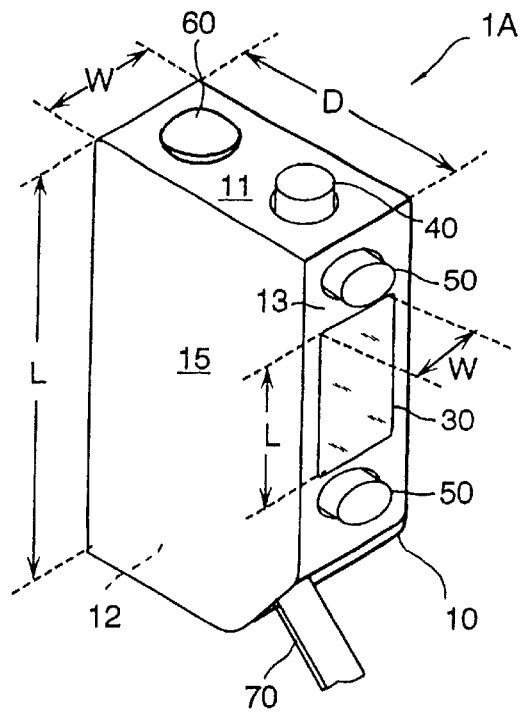
FIG. 1 is a rear perspective view of a triangulation type of photoelectric switch in accordance with a preferred embodiment of the present invention.
Figure 2:
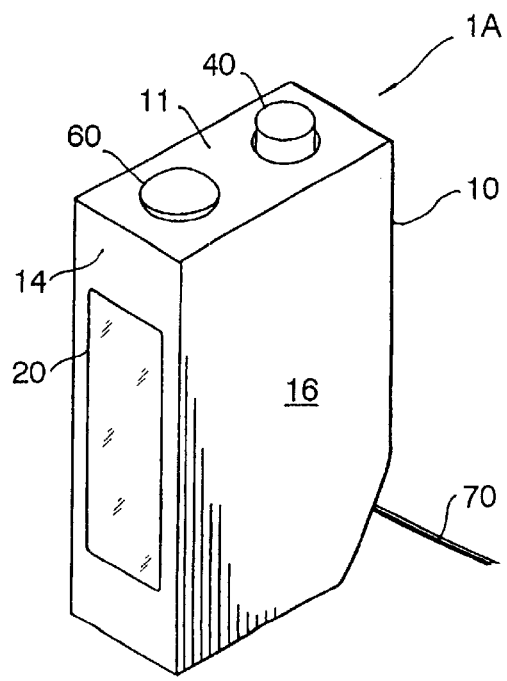
FIG. 2 is a front perspective view of the triangulation type of photoelectric switch of FIG. 1.

Referring to the drawings in detail and, in particular, to FIGS. 1 and 2 which show a triangulation type of photoelectric switch device 1A in accordance with a preferred embodiment of the present invention, the photoelectric switch device 1A has a generally rectangular box-shaped casing (which is hereafter referred to as a box casing for simplicity) 10 which is defined by top and bottom walls 11 and 12, front and rear frame walls 14 and 13 and right and left side walls 15 and 16. Although not limited, the box casing has dimensions of, for example, 30 mm height (L), 20 mm length (D) and 10.8 mm width (W) as shown in FIG. 1. The box casing 10 is provided with an optical head 20 fitted into the front frame wall 14 and a monitor display 30 having, for example, dimensions of 12 mm height and 6 mm width. Two adjusting switches 50 are installed at the rear frame wall 13 and have, for example, dimensions of 27 mm height and 17.8 mm width. In this example, the rear wall 13 has an area of 13% of the entire area of the box casing 10, and the monitor display 30 has an area of 25% of the area of the rear wall 13. This arrangement provides a clear view of the monitor display 30. The box casing 10 is further provided with a push button type of selecting/fixing/setting switch 40 and an indicator 60 configured in a dome shape, both being installed at the top wall 11 adjacent to the rear frame wall 13.

The switches 40 and 50 are known in various forms and may take any well-known form. The box casing 10 has a flat composite cable 70 for retrieving outputs from an optical position sensing device (PSD) 24 (see FIG. 3) which extends from a tapered rear bottom corner of the box casing 10. The flat composite cable 70 may be installed at the box casing 10 through the bottom wall 13.

Figure 3:
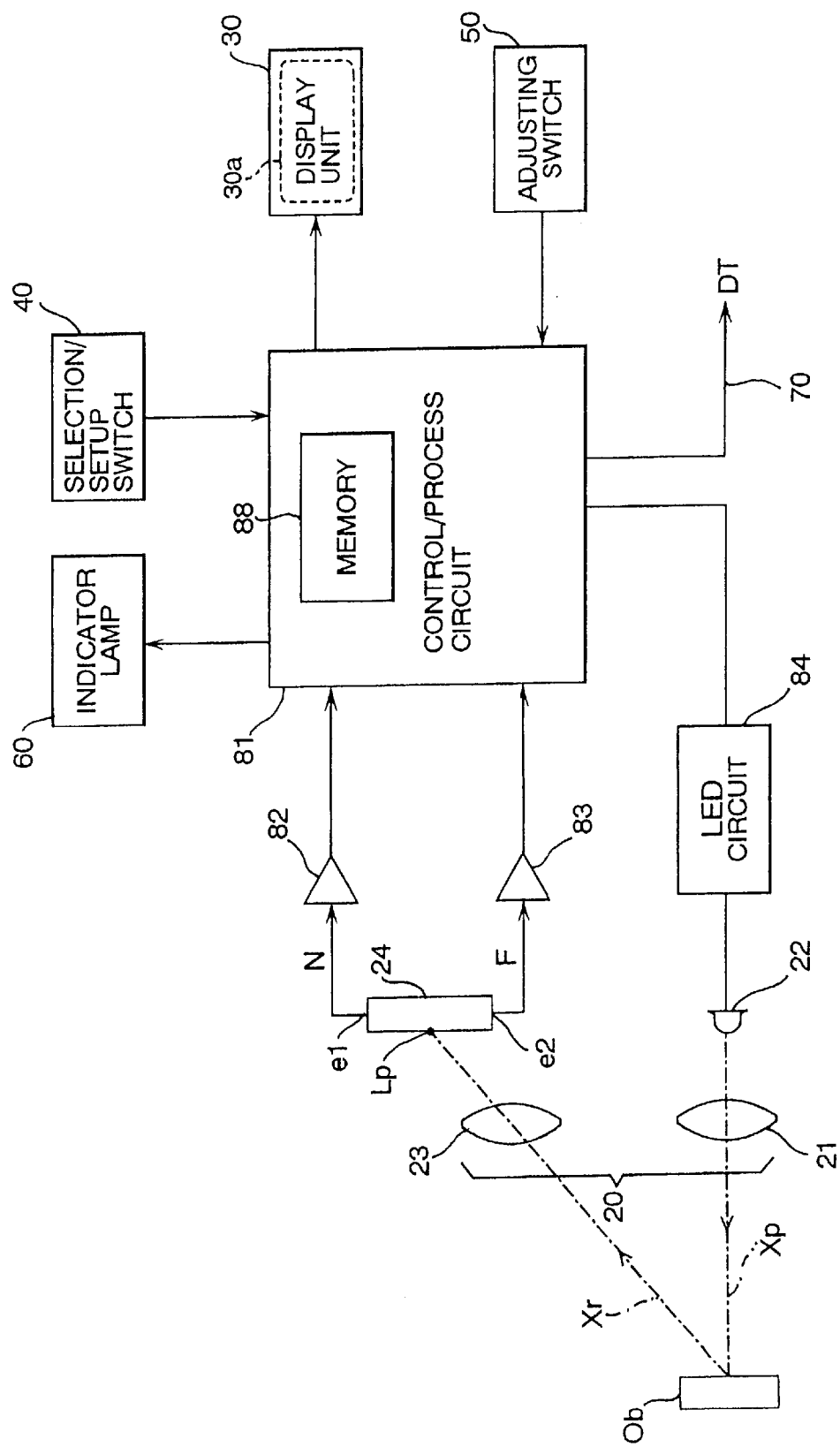
FIG. 3 is a block diagram illustrating the structure and function of the triangulation type of photoelectric switch of FIG. 1.

FIG. 3 is a block diagram showing the photoelectric switch device 1A. As shown, the photoelectric switch device 1A comprises a light projection lens 21 and a focusing lens 23 which form the optical head 20, a light emitting diode (LED) 22 as a light source, a drive circuit 84 for energizing LED 22, controlling/processing circuit 81 equipped with a memory 88 for processing position signals that are sent thereto from the photoelectric position sensing device (PSD) 24 through amplifiers 82 and 83 so as to provide information relating to light incident upon the photoelectric position sensing device (PSD) 24, a monitor display 30 with a display screen 30a for displaying the information, and an indicator 60 for providing an indication of the result of an object detection. The LED drive circuit 84 is actuated and controlled by the controlling/processing circuit 81 to excite LED 22 to emit light. The light rays emanating from LED 22 are converged and directed towards an object Ob located within a field of detection along an optical axis Xp of the projection lens 21, and then reflected by the object Ob. The reflected light rays are directed toward the photoelectric position sensing device (PSD) 24 and form a light spot Lp on the photoelectric position sensing device (PSD) 24 by the focusing lens 22. As was previously described, the photoelectric position sensing device (PSD) 24 provides photoelectric signals (currents) N and F whose signal (current) levels are proportional to distances of the light spot Lp to opposite extreme positions of the photoelectric position sensing device (PSD) 24, respectively. Specifically, one of the photoelectric signals, namely the photoelectric signal N, has a level of direct current proportional to the distance between the light spot Lp and one of opposite ends of the photoelectric position sensing device (PSD) 24, namely an end e1 Similarly, another photoelectric signal F has a level of direct current proportional to a distance between the light spot Lp and another end e2 of the photoelectric position sensing device (PSD) 24. These photoelectric signals N and F are transmitted to the controlling/processing circuit 81 through the amplifiers 82 and 83, respectively.

Figure 26A:
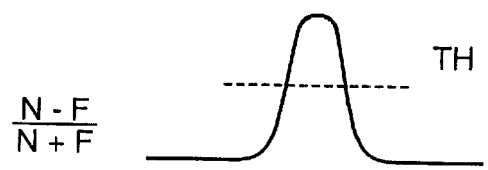
FIGS. 26A and 26B are explanatory diagrams showing the relationship between reference signal and threshold level.
Figure 26B:
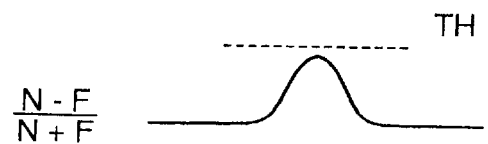
Figure 27A:
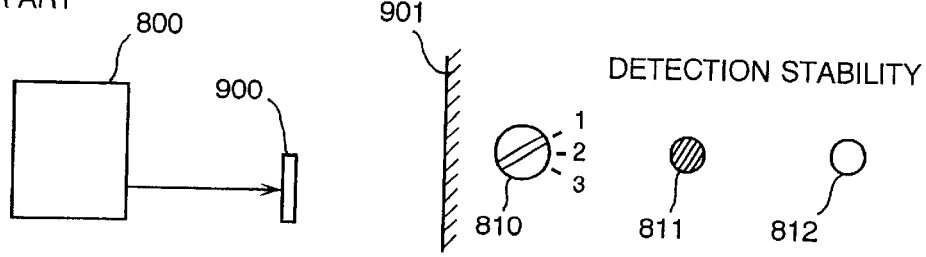
Figure 27B:
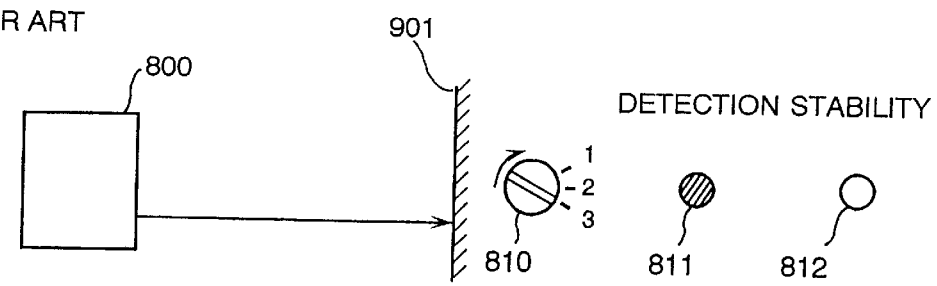
Figure 28C:
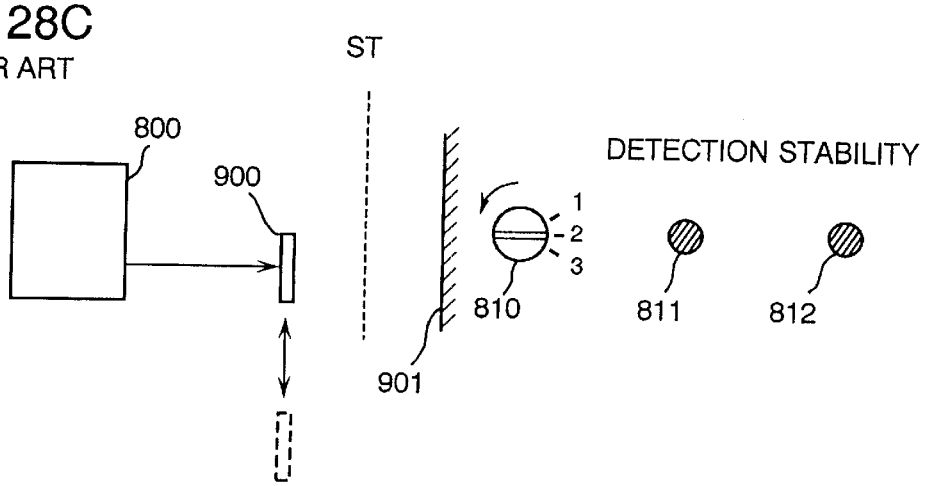

Detection of the presence of an object Ob is implemented on the basis of these photoelectric signals N and F with respect to a threshold value TH. Specifically, as was previously described in connection with FIGS. 26A and 26B, the controlling/processing circuit 81 computes a position signal $\{(N-F)/(N+F)\}$ and compares the position signal with the threshold value TH for determination as to whether the object Ob is present within the detectable region. Further, the controlling/processing circuit 81 displays a result and stability of the detection of an object Ob by lamps or any other luminescence elements comprising the indicator 60 as will be described later. If necessary, electric signals DT relating to the result and stability of detection are output to external instruments (not shown) through the cable 70. The term "ON state" as used herein shall mean and refer to a state of detection where there is an object Ob in the effective detection region D1, and the term "OFF-state" as used herein shall mean and refer to a state of detection where there is no object Ob in the ineffective detection region D2. Further, the stability of detection is represented by a difference in level between a position signal $\{(N-F)/(N+F)\}$ and a threshold value TH in spite of whether or not there is an object in the effective detection region D1 or in the ineffective detection region D2. Specifically, a state where the difference in level is less than a specified value is referred to as an unstable state, and a state where the difference in level is greater than the specified value is referred to as a stable state. The controlling/processing circuit 81 has a memory 88 for storing data of various information such as an object position (information representative of values of the present position signal), the threshold value TH, the result of an object detection, maximum and minimum values of the position signal, errors and the like. Data of the information is transferred to the monitor display 30 and changeably displayed in the form of numerical or character information on a display screen 30a of the monitor display 30 for providing the user with a visual indication.

Selecting/fixing/setting switch 40 is used to select a type of information that is to be displayed on the display screen 30a of the monitor display 30. Further, the selecting/fixing/setting switch 40 is also used to set up an adjustable value that is generated on the basis of the position signal as a reference value relating to the processing that is implemented by the controlling/processing circuit 81 and to fix a value that is displayed on the display screen 30a of the monitor display 30 and adjusted by adjusting switch 50 (which will be described later) as a substitutive reference value relating to the processing that is implemented by the controlling/processing circuit 81. The term "adjustable value" that is generated on the basis of the position signal refers to a value that is calculated on the basis of a position signal provided in a certain period of time or under a certain condition or a value of the position signal. For example, the adjustable value may be a middle value of a maximum and a minimum value of the position signal in a certain period of time, a middle value of position signals provided under two different conditions or a value of a position signal under a certain condition.

The controlling/processing circuit 81 changes types of information that are to be displayed on the display monitor 30 in response to selecting operation of the selecting/fixing/selecting switch 40. Then, it stores an adjustable value that is generated on the basis of the position signal as a set value in the memory 88 in response to setting operation of the selecting/fixing/selecting switch 40. Further, it stores the value of information displayed on the monitor display 30 as a substitutive set value in the memory 88 in response to fixing operation of the selecting/fixing/selecting switch 40. The adjusting switch 50 is used to adjust one of various values relating to the processing that is displayed on the monitor display 30.

Figure 4:
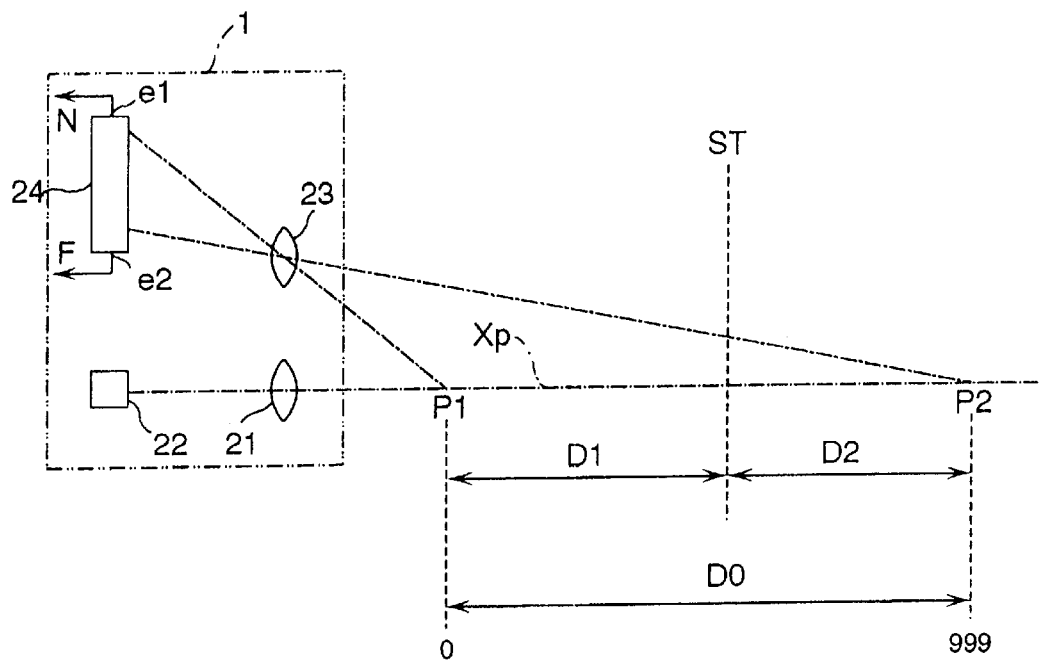
FIG. 4 an explanatory illustration showing the principle of triangulation according to the present invention.

FIG. 4 is a schematic illustration for explaining the relationship between a position signal and a threshold value TH for the object detection. A detectable region D0 is defined between extreme axial positions P1 and P2 on the optical axis Xp of the projection lens 21 within which light rays reflected by an object are focused as a light spot Lp on the photoelectric position sensing device (PSD) 24. A specific point ST is predetermined on the optical axis Xp in the detectable region D0 as a threshold point for distinction between the On-state and the OFF-state of the object detection. The detectable region D0 is divided into two subregions on opposite sides of the threshold point specifically, one of the two sub-regions is called an effective detection region D1 and extends between the closest position P1 to the photoelectric switch device 1A and the threshold point ST. Another sub-region region is called an ineffective detection region D2 and extends between the threshold point ST and the remotest position P2 from the photoelectric switch device 1A. The controlling/processing circuit 81 provides an ON-state detection when light rays reflected by an object in the effective detection region D1 are focused as a light spot Lp on the photoelectric position sensing device (PSD) 24 and an OFF-state detection even when light rays reflected by an object in the ineffective detection region D2 are focused as a light spot Lp on the photoelectric position sensing device (PSD) 24.

Axial positions of an object in the detectable region D0 and the threshold point ST are indicated by numerical position information from the closest position P1 as a datum point. For example, the detectable region D0 is given 999 axial positions with regular intervals starting from a position 0 at the closest position P1 and ending in a position 999 at the remotest position P2. The axial position of the threshold point ST located at the closest position P1 of the detectable region D0 is given by a numerical value of 0. On the other hand, the axial position of the threshold point ST located at the remotest position P2 of the detectable region D0 is given by a numerical value of 999. On the basis of numerical information of the given positions and the position of the threshold point ST, positions of both object and threshold point ST and a relative position of the object and the threshold point ST are easily detected. The positional numerical information is displayed on the display screen 30a of the monitor display 30.

Figure 5:
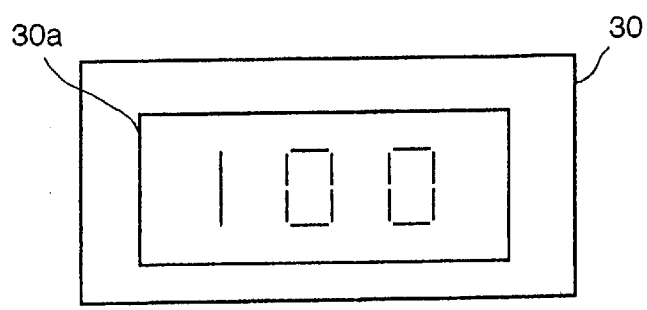
FIG. 5 is a schematic front view of a display screen of the triangulation type of photoelectric switch of FIG. 1.
Figure 6:
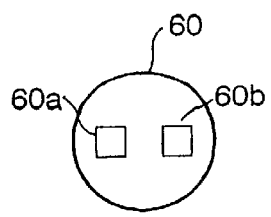
FIG. 6 is a schematic front view of an indicator of the triangulation type of photoelectric switch of FIG. 1.

FIG. 5 shows an image on the display screen 30a of the monitor display 30. The monitor display 30 selectively displays decimal digits and/or characters relating to information about object position, threshold position and the like on the display screen 30a. Further, as shown in FIG. 6, the indicator 60 is provided with a light emitting diode (LED) 60a for providing an indication of a result of detection (which is hereafter referred to as a detection result indication LED) and a light emitting diode (LED) 60b for providing an indication of the stability of detection (which is hereafter referred to as a detection stability indication LED). Specifically, the detection result indication LED 60a is excited and emits light when a result of detection is in the ON-state and is turned off when a result of detection is turned to the OFF-state. Similarly, the detection stability indication LED 60b is excited and emits light when detection is stable and is turned off when detection becomes unstable.

Information displayed on the display screen 30a of the monitor display 30 is replaced with other information by means of the selecting/fixing/setting switch 40. For example, whenever the selecting/fixing/setting switch 40 is pushed down and up, information on the display screen 30a are circulated in specified order and displayed on the display screen 30a of the monitor display 30. Specifically, information of an object position, a threshold position, a current amount, maximum and minimum amounts of light incident upon the photoelectric position sensing device (PSD) 24, maximum and minimum levels of reference position signals, a detection error are circulated and displayed on the display screen 30a in this order. The numerical information, such as the threshold position displayed on the display screen 30a of the monitor display 30, is changed by an increment of a specified value every time one of the adjusting switches 50 is pushed down and up or by a decrement of a specified value every time another adjusting switch 50 is pushed down and up. Further, the data of the information displayed on the display screen 30a, such as a maximum amount of light incident upon the photoelectric position sensing device (PSD) 24, can be entered and stored in the memory 88 for updating a set value. This is carried out by keeping the selecting/fixing/setting switch 40 pushed down for a specified period of time while the information is on the display screen 30a.

The controlling/processing circuit 81 computes the threshold value TH on the basis of a maximum amount of light incident upon the photoelectric position sensing device (PSD) 24 (or an amount of light reaching the effective detection region D1) and a minimum amount of light incident upon the photoelectric position sensing device (PSD) 24 (or an amount of light reaching the ineffective detection region D2). Data of information relating to the amount of light incident upon the photoelectric position sensing device (PSD) 24 that is displayed on the display screen 30a of the monitor display 30 can be entered and stored in the memory 88 for data updating a set value by keeping the selecting/fixing/setting switch 40 pushed down for the specified period of time while the information is on the display screen 30a.

FIGS. 7A–7C, 8A–8C and 9A–9C show various practical ways to select, fix or set up information by means of the selecting/fixing/setting switch 40.

Figure 7A:
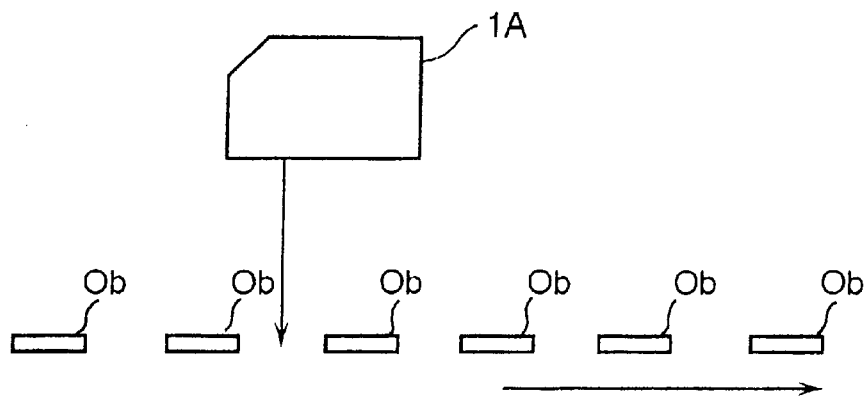
FIGS. 7A to 7C diagrammatically show an example of setting operation using a selecting/fixing/setting switch.
Figure 7B:
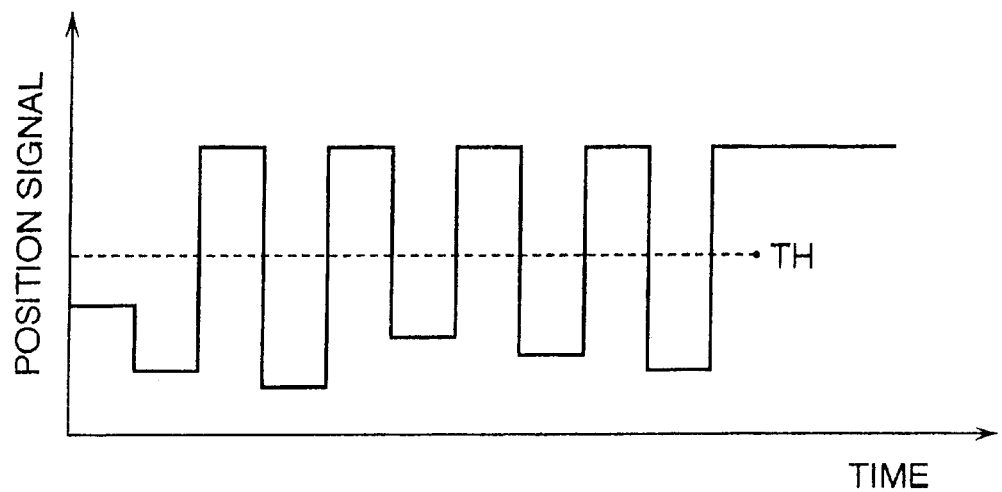
Figure 7C:
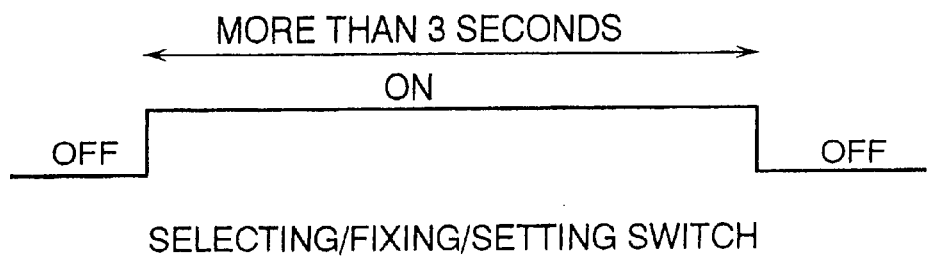

Referring to FIGS. 7A–7C showing one practical way of setting a threshold value TH by means of the selecting/fixing/setting switch 40 in which the threshold value TH is set up by the use of moving objects, the photoelectric switch device 1A is fixedly positioned above a moving conveyer (not shown) on which objects Ob are placed as shown in FIG. 7A. When the photoelectric switch device 1A is powered on while the conveyer is moving, it detects objects Ob on the conveyer one after another and provides position signals N and F. While the selecting/fixing/setting switch 40 is continuously pushed on for a specified period of time, for example more than three seconds in this embodiment, as shown in FIG. 7C, the control/processing circuit 81 samples the position signals N and F and computes a middle value of the maximum and minimum position signals {(N−F)/(N+F)} as shown in FIG. 7B. These values are obtained on the basis of the sampled position signals N and F as shown in FIG. 7C, as a threshold value TH. When the selecting/fixing/setting switch 40 is released, the threshold value TH is displayed on the display screen 30a of the monitor display 30.

Figure 8A:
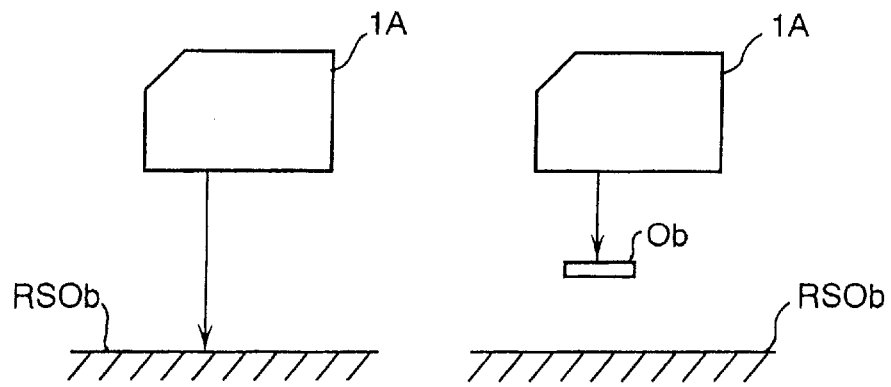
FIGS. 8A to 8C diagrammatically show another example of setting operation using a selecting/fixing/setting switch.
Figure 8B:
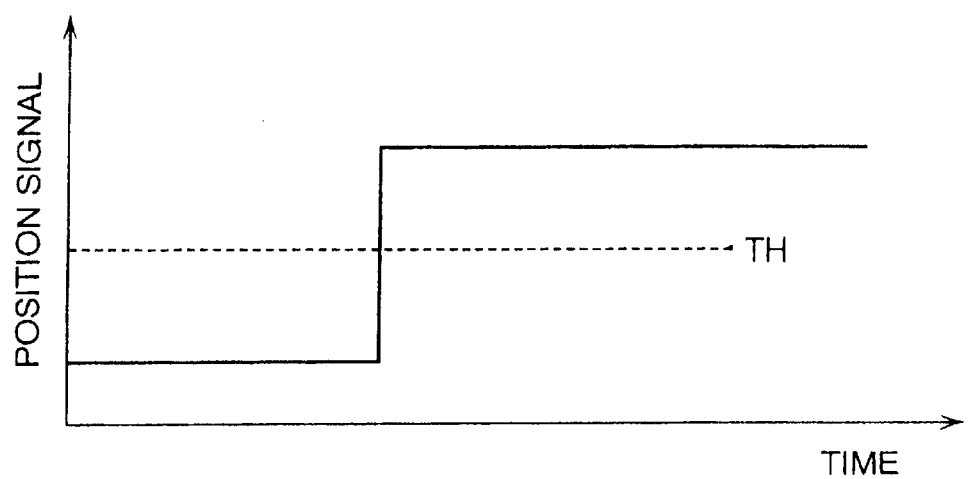
Figure 8C:
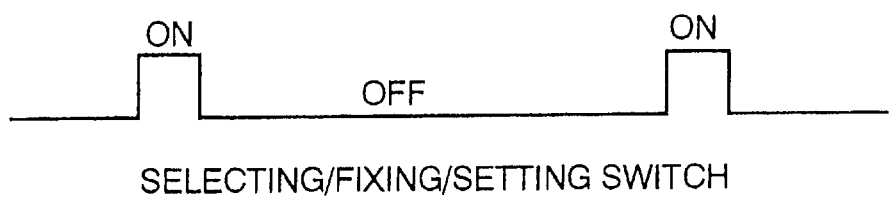

Referring to FIGS. 8A–8C showing another practical way of setting a threshold value TH by means of the selecting/fixing/setting switch 40 in which the threshold value TH is set up by the use of a stationary object, the photoelectric switch device 1A is positioned above a stationary reflective reference surface or object RSOb before or after being powered on. When the photoelectric switch device 1A is positioned at a desired distance from the stationary reflective reference object RSOb as shown in FIG. 8A, the selecting/fixing/setting switch 40 is continuously pushed for a while and released as shown in FIG. 8C. This provides a position signal {(N−F)/(N+F)} on the basis of position signals N and F relating to the stationary reflective reference object RSOb as shown in FIG. 8B. Thereafter, an object Ob is placed between the selecting/fixing/setting switch 40 and the stationary reflective reference object RSOb as shown in FIG. 8A, and then the selecting/fixing/setting switch 40 is continuously pushed for a while and released as shown in FIG. 8C. This provides a position signal {(N−F)/(N+F)} on the basis of position signals N and F relating to the object Ob as shown in FIG. 8B. When the selecting/fixing/setting switch 40 is released, the controlling/processing circuit 81 computes a middle value of the position signals {(N−F)/(N+F)} relating to the stationary reflective reference object RSOb and the object Ob, respectively, as a threshold value TH and displays the value on the display screen 30a of the monitor display 30.

Figure 9A:
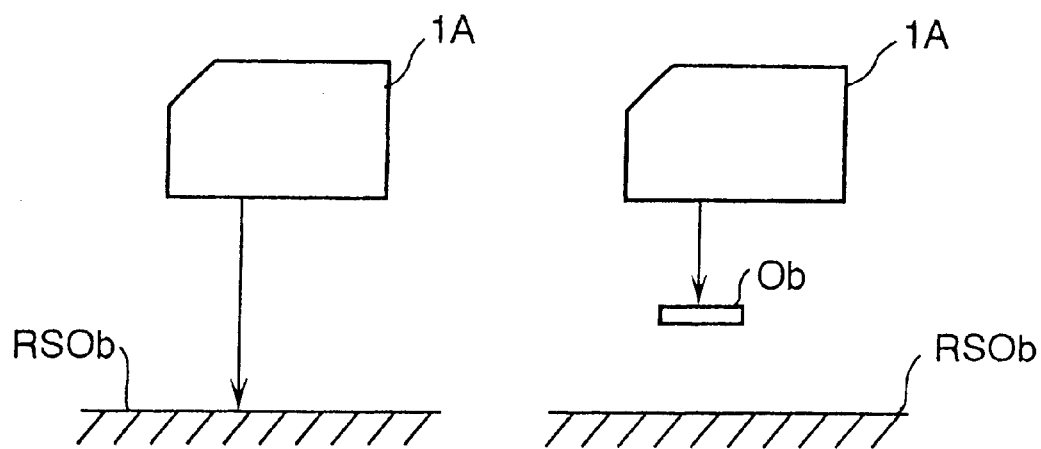
FIGS. 9A and 9B diagrammatically show still another example of setting operation using a selecting/fixing/setting switch.
Figure 9B:
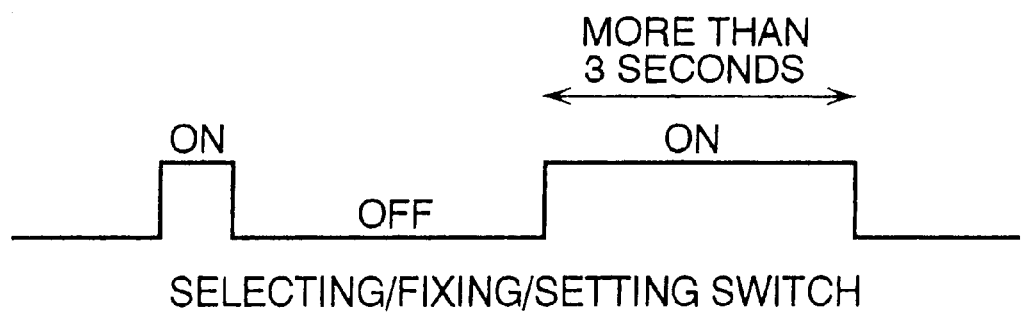

Referring to FIGS. 9A and 9B showing still another practical way of setting a threshold value TH by means of the selecting/fixing/setting switch 40 in which the threshold value TH is set up by the use of an object at a specified distance from the selecting/fixing/setting switch 40, the photoelectric switch device 1A is positioned above a stationary reflective reference object RSOb before or after being powered on. When the photoelectric switch device 1A is positioned at a desired distance from the stationary reflective reference object RSOb as shown in FIG. 9A, the selecting/fixing/setting switch 40 is continuously pushed for a while and released as shown in FIG. 9C. This provides a position signal {(N−F)/(N+F)} on the basis of position signals N and F relating to the stationary reflective reference object RSOb as shown in FIG. 9B. Thereafter, an object Ob is placed between the selecting/fixing/setting switch 40 and the stationary reflective reference object RSOb at a specified distance from the selecting/fixing/setting switch 40 as shown in FIG. 9A, and then the selecting/fixing/setting switch 40 is continuously pushed for a specified period of time, for example more than three seconds in this embodiment, as shown in FIG. 9B to provide a position signal {(N−F)/(N+F)} on the basis of position signals N and F relating to the object Ob as shown in FIG. 9A. When the selecting/fixing/setting switch 40 is released, the controlling/processing circuit 81 computes a middle value of the position signals {(N−F)/(N+F)} relating to the stationary reflective reference object RSOb and the object Ob, respectively, as a threshold value TH and displays it on the display screen 30a of the monitor display 30.

Figure 10:
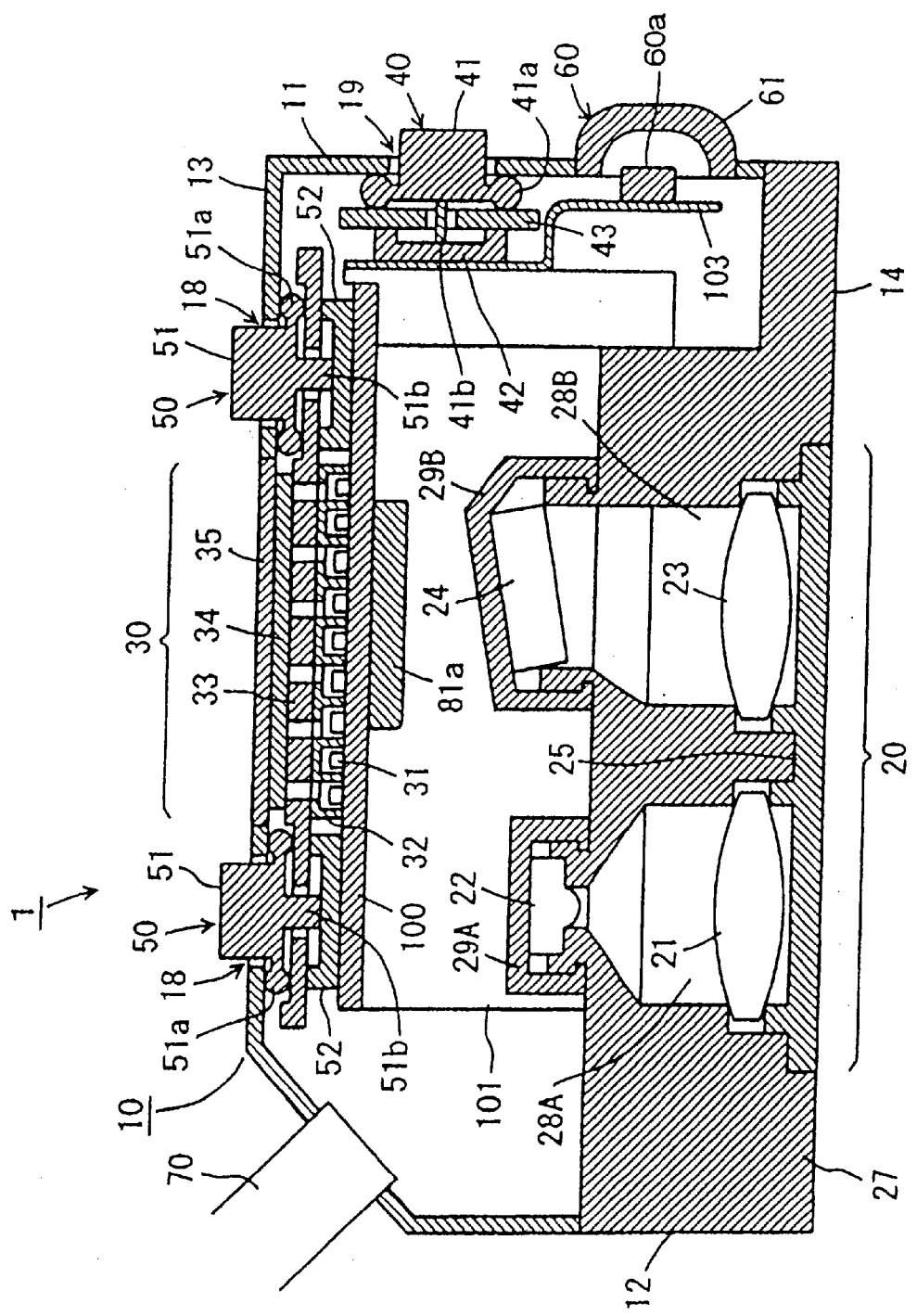
FIG. 10 is an elevational cross-sectional view of the triangulation type of photoelectric switch of FIG. 1.
Figure 11:
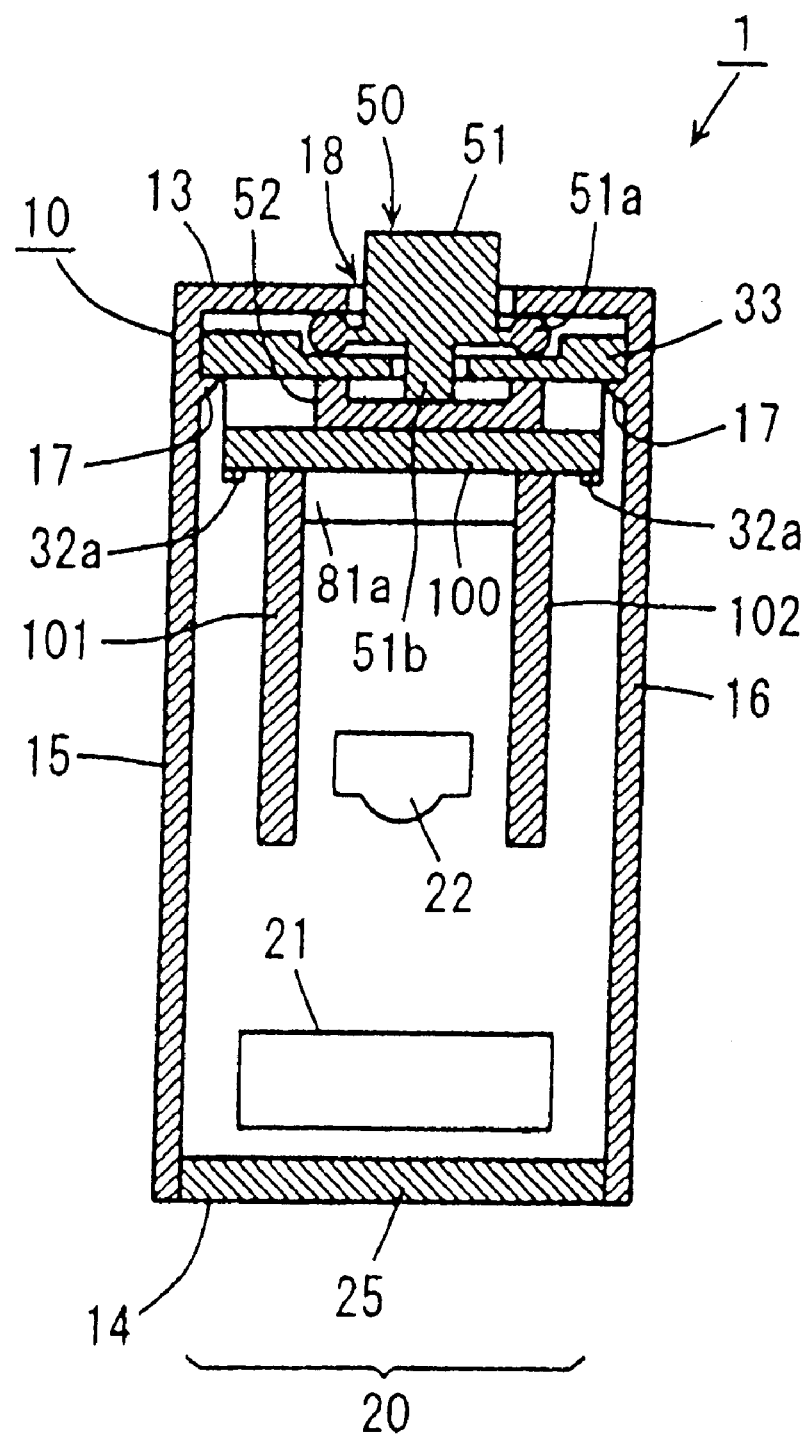
FIG. 11 is a transverse cross-sectional view of the triangulation type of photoelectric switch of FIG. 1.
Figure 12:
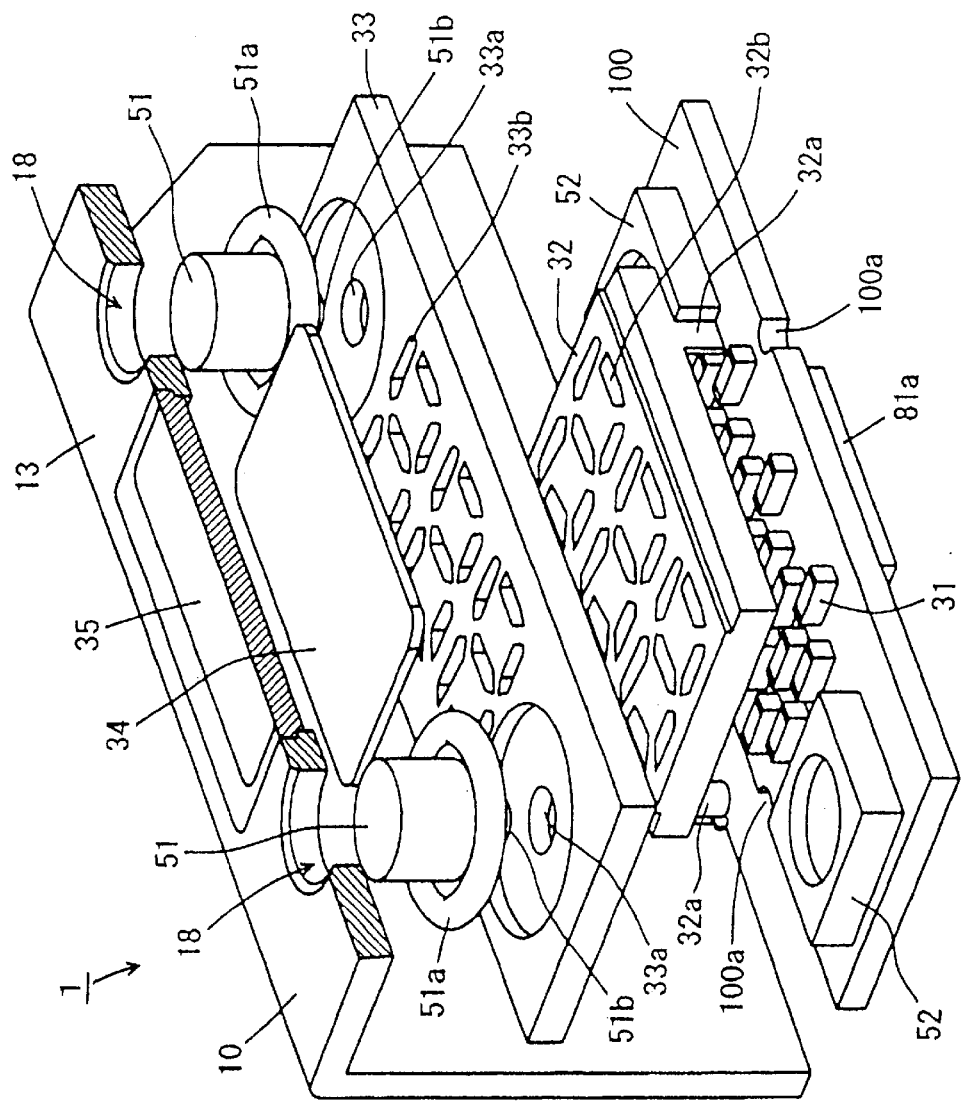
FIG. 12 is an exploded perspective view of the monitor unit of FIG. 5.

FIGS. 10 through 12 show details of the interior construction of the photoelectric switch device 1A shown in FIGS. 1 and 2.

Referring to FIG. 10 which is a side elevational cross-sectional view of the photoelectric switch device 1A, the generally rectangular box-shaped casing 10 is provided with the optical head 20 fitted into the front frame wall 14. The optical head 20 comprises a transparent window, a lens holder 25 which has annular lens holder frames arranged side by side in a vertical direction, and a support frame (not shown in FIG. 10) mounted behind the lens holder 25. The lens holder 25 holds the projection lens 21 and the focusing lens 23 mounted in the annular lens holders 28A and 28B, respectively, with their optical axes Xp and Xr in parallel with each other. The annular lens holders 28A and 28B are formed integrally with each other and may be formed integrally with the transparent window as one whole. A support frame, which supports the LED 22 and the photoelectric position sensing device (PSD) 24 in position with respect to the projection lens 21 and the focusing lens 23, respectively, may be formed integrally with the lens holder 25 and, however, is desirably separate from the lens holder 25 so as to make it possible to adjust the LED 22 and the photoelectric position sensing device (PSD) 24 in axial position with respect to the projection lens 21 and the focusing lens 23. In order to eliminate optical noise, the support frame 26 is desirably made of a light shielding member so as to keep the position sensing device (PSD) 24 from ambient light.

The box casing 10 is further provided with a monitor display 30 and upper and lower adjusting switches 50 disposed on opposite sides of the display screen 30a of the monitor display 30 in the vertical direction and are all installed at the rear frame wall 13. The monitor display 30 comprises a display screen 30a such as a transparent plate fitted into the rear frame wall 13, a diffuser screen 34 and a seven-segment digit/character display assembly 35 which will be described in detail later. Each adjusting switch 50 comprises a cylindrical push button 51 with an elastic 0-ring 51a and a push rod 51b formed integrally therewith and a switch button 52. The push button 51 is situated in a hole 18 formed in the rear frame wall 13 and partially projects outside the box casing 10 for external access. The elastic O-ring 51 is pressed against the rear frame wall 13 so as to shield the interior of the box casing 10 from ambient light.

Referring to FIGS. 11 and 12 showing the monitor display 30 and one of the adjusting switches 50 in detail, the seven-segment digit/character display assembly 35 includes a seven-segment digit display plate 33, a seven-segment digit masking plate 32 and a display circuit plate 100 which are put on top of one another with appropriate separations and united as one whole. This seven-segment digit/character display assembly 35 is mounted to the box casing 10 by pressing the seven-digit display plate 33 toward the rear frame wall 13 and holding it by means of ribs 17 (see FIG. 11) of the side walls 15 and 16. The display circuit plate 100 is provided with a number of, specifically 21, segmental light emitting diode (LED) 31 which are secured to one side of the display circuit plate 100 and arranged such that three, seven-segment digits are arranged in a straight line with regular intervals. The adjusting switch buttons 52 are arranged on opposite sides of both three digits arrangement of segmental light emitting diodes 31 and the seven-segment digit masking plate 32 and are secured to the one side of the display circuit plate 100. An integrated circuit 81a forming the controlling/processing circuit 81 is secured to another side of the display circuit plate 100.

The seven-segment digit masking plate 32 is mounted on the display circuit plate 100 with a separation by means of hooks 32a in engagement with notches 100a of the display circuit plate 100 and attached in contact with the seven-segment digit display plate 33 in a manner which is well known in the art. The seven-segment digit masking plate 32 is formed with 21 slots 32b arranged in a pattern corresponding to the three digits arrangement of segmental light emitting diodes 31 on display circuit plate 100. The three digits of segmental light emitting diodes 31 on the display circuit plate 100 are in alignment in position with the three digits of segmental slots 32b of the seven-segment digit masking plate 32, respectively, by means of the engagement between the hooks 32a and the notches 100a.

The seven-segment digit display plate 33 is formed with 21 segmental slots 33b arranged in a pattern corresponding to the three digits arrangement of segmental light emitting diodes 31 on the display circuit plate 100. The seven-segment digit display plate 33 is further formed with holes 33a which are arranged on opposite sides of the three digits arrangement of segmental slots 33b and through which the push rod 51b of the push button 51 extends to the switch button 52. The diffusion screen 34 is put between the transparent display screen 30a and the seven-segment digit display plate 33. As shown in detail in FIG. 11, each of the adjusting switches 50 is installed into the photoelectric switch device 1A by inserting the push button 51 into the hole 18 from the inside of the box casing 10 and thereafter by fitting the seven-segment digit/character display assembly 35 so as to bring the button switch 52 into engagement with the push rod 51b. The elastic O-ring 51 is pressed against the rear frame wall 13 by the seven-segment digit display plate 33 pressed toward the rear frame wall 13 and held by the ribs 17. The display circuit plate 100 at its back has circuit plates 101 and 102 which are arranged in parallel to each other and perpendicular to the display circuit plate 100. The circuit plate 101 is provided with a power source circuit (not shown) printed thereon, and the circuit plate 102 is provided with an LED drive circuit 84 printed thereon and its associated parts.

Referring back to FIG. 10, the selecting/fixing/setting switch 40 comprises a cylindrical push button 41 with an elastic O-ring 41a and a push rod 41b formed integrally therewith and a switch button 42. The push button 41 is situated in a hole 19 formed in the top wall 11 and partly projects outside the box casing 10 for external access. The elastic O-ring 41a is pressed against the top wall 11 so as to shield the interior of the box casing 11 from ambient light. The box casing 10 is provided with a mount 43 which fixedly mounts the switch button 42 at one side thereof The mount 43 is formed with a hole through which the push rod 41b extends to the switch button 42. A circuit plate 103, which mounts the detection result indication LED 60a and the detection stability indication LED 60b of the indicator 60 thereon and excites them, is secured to an integral part (not shown) of the box casing 10 and extends to the indicator 60 so as to place the detection result indication LED 60a and the detection stability indication LED 60b within the opening 61a below the transparent cover 61. The adjusting switches 50 is installed into the photoelectric switch device 1A by inserting the push button 41 into the hole 19 from the inside of the box casing 10 and thereafter fitting the mount 43 to the top wall 11 in a well known manner so as to press the elastic O-ring 41a against the top wall 11 and to bring the button switch 42 into engagement with the push rod 41b. When the selecting/fixing/setting switch 40 is installed to the box casing 10, the circuit plate 103 places the detection result indication LED 60a and the detection stability indication LED 60b within the opening 61a below the transparent cover 61.

As apparent from the above detailed description, the photoelectric switch device 1A is configured to have the optical head 20 and the monitor display 30 disposed on the front and rear frame walls 14 and 13, respectively, so that, even though the photoelectric switch device 1A is preferably as small in size as possible, the box casing 10 provides sufficiently large spaces for installation of the optical head 20 and the monitor display 30. This results in highly precise object detection and easy and accurate recognition of information by users.

Moreover, the photoelectric switch device 1A has the selecting/fixing/setting switch 40 and the adjusting switch 50 respectively disposed on the top wall and the rear frame wall 13 of the box casing 10 which are adjacent each other, so that the selecting/fixing/setting switch 40 and adjusting switch 50 are easily prevented from being mixed up or erroneously operated. Further, since the photoelectric switch device 1A has the monitor display 30 and the adjusting switch 50 which are disposed on the same side of the box casing 10, i.e. at the rear frame wall 13 in this embodiment, users are enabled to operate the adjusting switch 50 easily and accurately to adjust or change information such as a threshold value TH displayed on the display screen 30a while viewing and confirming the information on the display screen 30a. Employing a push button type of switch for the adjusting switches 50 and forming the push button 51 of each switch 50 integrally with the O-ring 51a makes it possible to configure a miniaturized and sufficiently air-tight photoelectric switch device 1A and provides the photoelectric switch device 1A with a large space for installing the monitor display 30. It further makes it possible to employ a large push button 51 to facilitate operability. Similarly, employing a push button type of switch for the selecting/fixing/setting switch 40 and forming the push button 41 integrally with the O-ring 41a makes it possible to install a large size of indicator for the indicator 60 while providing a miniaturized and air-tight photoelectric switch device 1A. It further makes it possible to employ a large push button 51, which leads to improved selecting/fixing/setting operation.

Disposing the cable 70 at a tapered corner between the bottom wall 12 and the rear frame wall 13 makes it possible to use the entire area of the top wall 11 to install a large selecting/fixing/setting switch 40 and a large indicator 60 without restraining miniaturization of the photoelectric switch device 1A and also to provide the rear frame wall 13 with a large space available for installing a large monitor display 30 and a large adjusting switches 50. Further, disposing the cable 70 at the tapered corner between the bottom wall 12 and the rear frame wall 13 keeps the optical head 20 from being blocked by the cable 70.

The photoelectric switch device 1A and its associated functional elements may be variously modified as will be described below.

Figure 13:
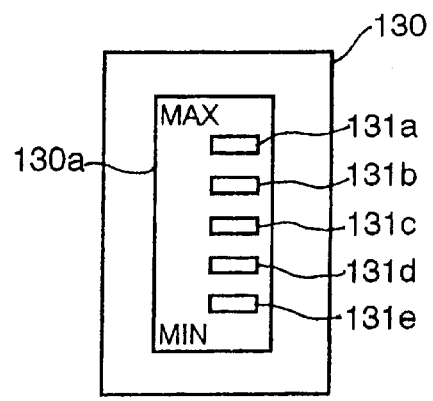
FIG. 13 is a schematic front view of a variant of the display screen of FIG. 5.

FIG. 13 shows a variant of the monitor display 30 of the photoelectric switch device 1A shown in FIGS. 1 and 2. As shown, a monitor unit 130 comprises a vertical straight row of light emitting diodes (LEDs) 131a to 131e. In this variant, the monitor unit 130 indicates a level or value of information relating to object detection by increasingly exciting the light emitting diodes according to the levels or values. For example, the monitor unit 130 excites the lowermost light emitting diode 131a for a minimum level of light incident upon the photoelectric position sensing device (PSD) 24 and excites all of the light emitting diodes 131a through 131e for a maximum level of light incident upon the photoelectric position sensing device (PSD) 24.

FIGS. 14 to 19 show various variants of the adjusting switch 50 of the photoelectric switch device 1A shown in FIGS. 1 and 2.

Figure 14:
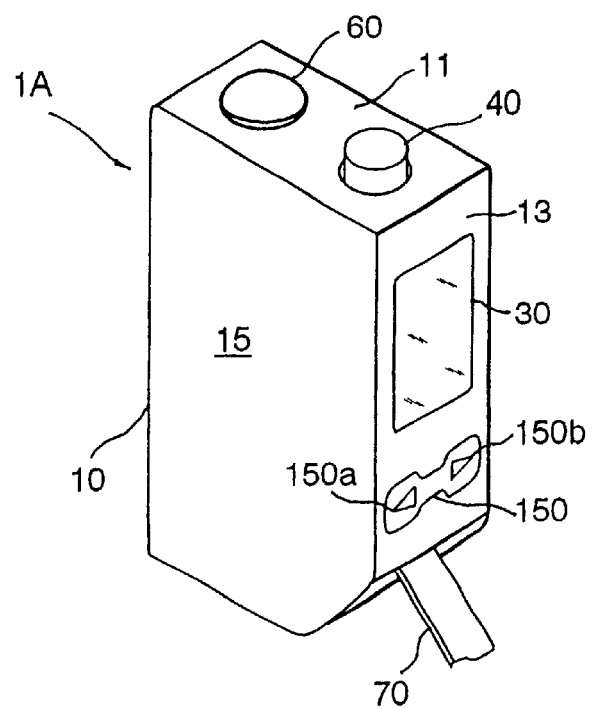
FIG. 14 is a rear perspective view of the triangulation type of photoelectric switch which is provided with another type of adjusting switch.

Referring to FIG. 14 showing the photoelectric switch device 1A with a see-saw type of switch 150 which is employed in place of the adjusting switch 50. The see-saw switch 150, which is positioned below the monitor display 30 and sideways on the rear frame wall 13, operates to increase a level or value of information relating to object detection when pushed down at one of opposite ends, e.g at. The end 150a in this embodiment, thereof or to decrease the level or the value of information relating to object detection when pushed down at another end 150b thereof.

Figure 15:
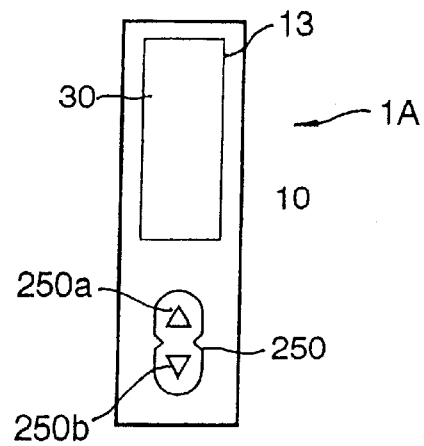
FIG. 15 is a rear view of the triangulation type of photoelectric switch which is provided with another type of adjusting switch.

Referring to FIG. 15 showing the photoelectric switch device 1A with a see-saw type of switch 250 which is employed in place of the adjusting switch 50. The see-saw switch 250, which is positioned below the monitor display 30 and vertically on the rear frame wall 13, operates to increase the level or value of information relating to object detection when pushed down at one of opposite ends, e.g. at the end 250a in this embodiment, thereof or to decrease the level or value of information relating to object detection when pushed down at another end 250b thereof.

Figure 16:
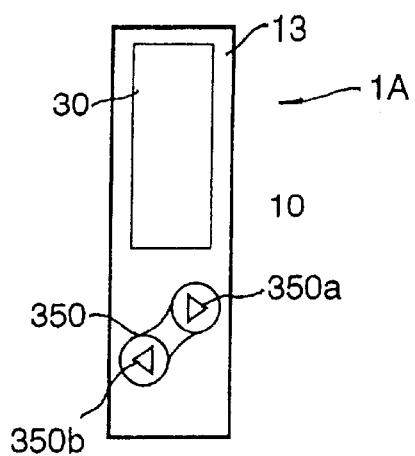
FIG. 16 is a rear view of the triangulation type of photoelectric switch which is provided with another type of adjusting switch.

Referring to FIG. 16 showing the photoelectric switch device 1A with a see-saw type of switch 350 which is employed in place of the adjusting switch 50. The see-saw switch 350, which is positioned below the monitor display 30 and slantwise on the rear frame wall 13, operates to increase a level or value of information relating to object detection when pushed down at one of two push buttons, e.g. at the push button 350a in this embodiment, thereof or to decrease the level or value of information relating to object detection when pushed down at another push button 350b thereof.

Figure 17:
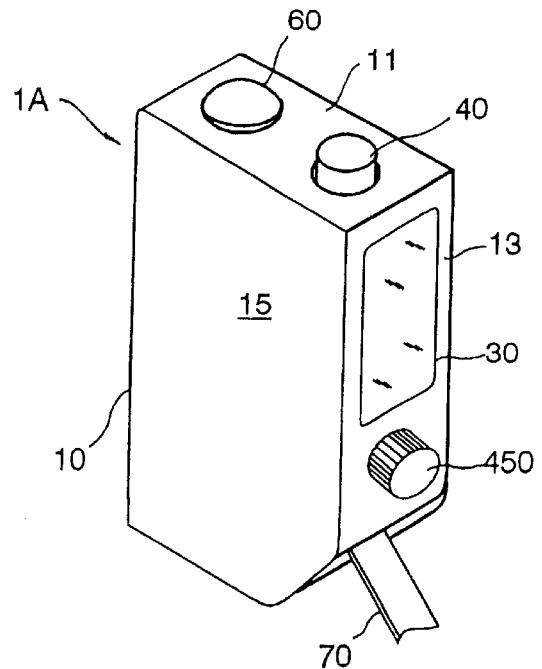
FIG. 17 is a rear perspective view of the triangulation type of photoelectric switch which is provided with another type of adjusting switch.

Referring to FIG. 17 showing the photoelectric switch device 1A with a volume dial knob type of switch 450 which is employed in place of the adjusting switch 50, the volume dial knob 450, which is positioned below the monitor display 30 on the rear frame wall 13, operates to increase a level or value of information relating to object detection when turned in one of opposite directions, e.g. in a counterclockwise direction in this embodiment, or to decrease the level or value of information relating to object detection when turned in the clockwise direction.

Figure 18:
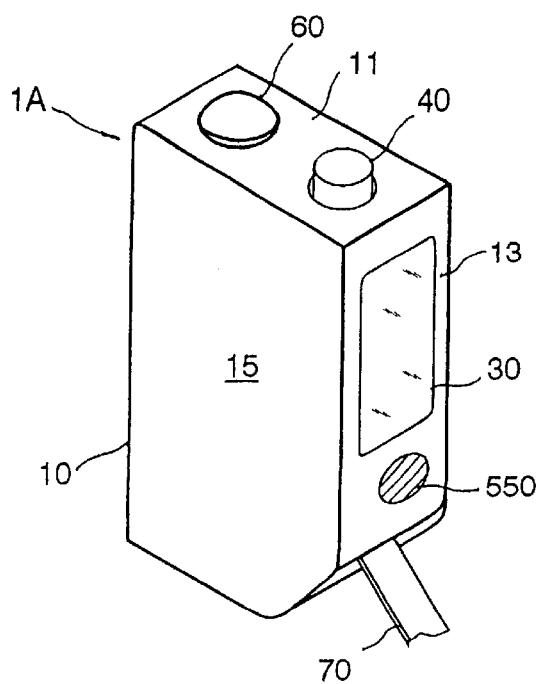
FIG. 18 is a rear perspective view of the triangulation type of photoelectric switch which is provided with still another type of adjusting switch.

Referring to FIG. 18 showing the photoelectric switch device 1A with a trimmer type of switch 550 which is employed in place of the adjusting switch 50, the trimmer dial switch 550, which is positioned below the monitor display 30 on the rear frame wall 13, operates to increase a level or value of information relating to object detection when turned in one of opposite directions, e.g. in a counterclockwise direction in this embodiment, or to decrease the level or value of information relating to object detection when turned in the clockwise direction.

Figure 19:
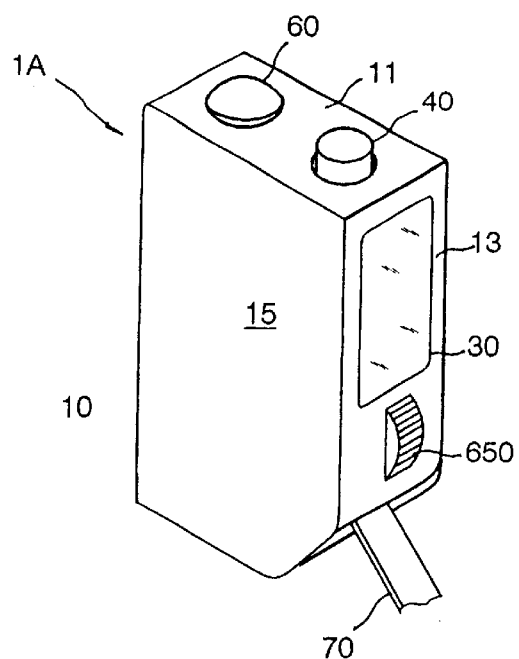
FIG. 19 is a rear perspective view of the triangulation type of photoelectric switch which is provided with a further type of adjusting switch.

Referring to FIG. 19 showing the photoelectric switch device 1A with a jog dial type of switch 650 which is employed in place of the adjusting switch 50, the jog dial switch 650, which is positioned below the monitor display 30 on the rear frame wall 13, operates to increase a level or value of information relating to object detection when slid in one of opposite directions, e.g. upward in this embodiment, or to decrease the level or value of information relating to object detection when slid downward.

Other various switches that are well known in the art may be employed for the adjusting switch 50.

Figure 20:
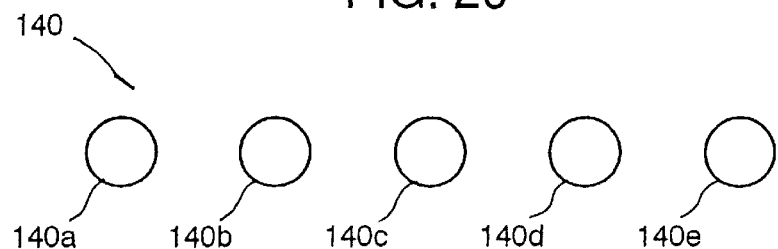
FIG. 20 is a schematically illustrates a selecting/fixing/setting switch arrangement of the triangulation type of photoelectric switch of FIG. 1.
Figure 21:
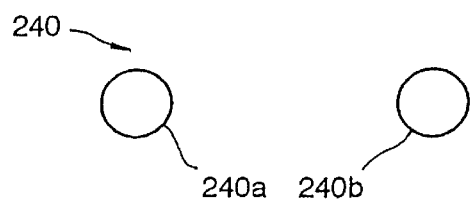
FIG. 21 is a schematically illustrates a selecting/fixing/setting switch arrangement of the triangulation type of photoelectric switch of FIG. 1.

FIGS. 20 and 21 show variants of the selecting/fixing/setting switch 40 of the photoelectric switch device 1A shown in FIGS. 1 and 2.

Referring to FIG. 20 showing the photoelectric switch device 1A with a switch arrangement 140 comprising a plurality of, for example five in this embodiment, switches 140a to 140e which are arrange on the top wall 11 place of the selecting/fixing/setting switch 50 and assigned to specific information. That is, the selecting/fixing/setting switch 140a operates to select and display information relating to an object position on the display screen 30a of the monitor display 30 when pushed down. The selecting/fixing/setting switch 140b operates to select and display information relating to a threshold value TH on the display screen 30a of the monitor display 30 when pushed down. The selecting/fixing/setting switch 140c operates to select and display information relating to a result of detection on the display screen 30a of the monitor display 30 when pushed down. The selecting/fixing/setting switch 140d operates to select and display information relating to stability of detection on the display screen 30a of the monitor display 30 when pushed down. Further, the selecting/fixing/setting switch 140e operates to select and display information relating to an error of detection on the display screen 30a of the monitor display 30 when pushed down. Data of information displayed on the display screen 30a of the monitor display 30 is transferred to and stored in the memory 88 of the controlling/processing circuit 81 as a updated information when concurrently pushing down a specified combination of a selecting/fixing/setting switch assigned to the information and a specified one of the selecting/fixing/setting switches 140a to 140e.

Referring to FIG. 21 showing the photoelectric switch device 1A with a selecting/fixing/setting switch arrangement 240 comprising a selection switch 240a and a setup switch 240b which are arranged on the top wall 11 in place of the selecting/fixing/setting switch 40. The selection switch 240a functions to circulate various information on the display screen 30a of the monitor display 30 while it remains pushed down and fixedly display information that is displayed on the display screen 30a when the selection switch 240a is released. The setup switch 240b functions to transfer and store data of information that is fixedly displayed on the display screen 30a of the monitor display 30 as updated information when it is pushed down. In the case where information on the display screen 30 of the monitor display 30 is adjusted or changed by the use of the adjusting switch 50, the controlling/processing circuit 81 may be structured so as to automatically transfer and store data of the information on the display screen of the monitor display 30.

Figure 22:
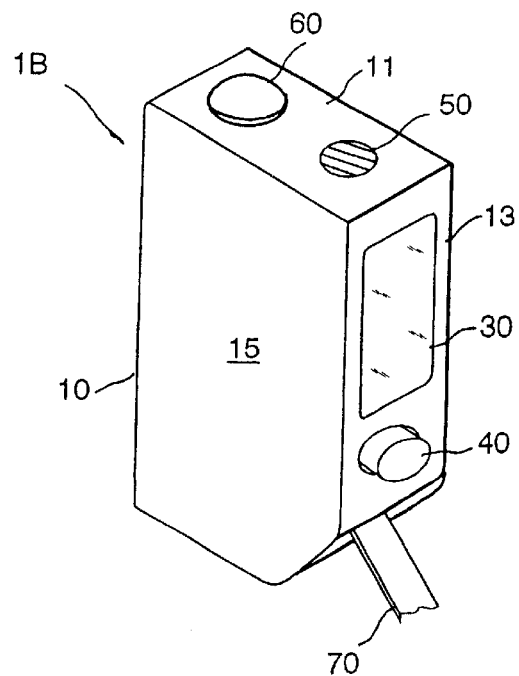
FIG. 22 is a rear perspective view of a triangulation type of photoelectric switch in accordance with another preferred embodiment of the present invention.

FIG. 22 shows a triangulation type of photoelectric switch device 1B according to another preferred embodiment of the invention. The photoelectric switch device 1B has switches 40 and 50 which are the same in function and structure as those of the photoelectric switch device 1A shown in FIG. 18 but are replaced in position with each other as compared with those of the photoelectric switch device 1A shown in FIG. 18. Specifically, a push button type of single selecting/fixing/setting switch 40 is disposed below a display screen 30 on a rear frame wall 13, and a trimmer type of adjusting switch 50 is disposed behind an indicator 60 on the top wall 11.

As in the photoelectric switch devices 1A shown in FIGS. 1 and 2, having the photoelectric switch device 1B with the optical head 20 and the monitor display 30 disposed on the front and rear frame walls 14 and 13, respectively, even though the photoelectric switch device 1B is intended to be as small in size as possible, the box casing 10 provides sufficiently large spaces for installation of the optical head 20 and the monitor display 30, which leads to highly precise object detection and easy and accurate recognition of information by users. Moreover, since the photoelectric switch device 1B has the monitor display 30 and the selecting/fixing/setting switch 40 which are disposed on the same side of the box casing 10, i.e. at the rear frame wall 13, users are enabled to operate the adjusting switch 50 easily and accurately to select or decide information on the display screen 30a while viewing and confirming the information on the display screen 30a.

Further, the photoelectric switch device 1B has the selecting/fixing/setting switch 40 and the adjusting switch 50 disposed respectively on the top wall and the rear frame wall 13 of the box casing 10 which are adjacent each other, so that these selecting/fixing/setting switch 40 and adjusting switch 50 are easily prevented from being mixed up or erroneously operated. Similarly, the photoelectric switch device 1B has the adjusting switch 50 and the indicator 60 disposed on the same side of the box casing 10, i.e. on the top wall 13 of the box casing 10, so that users are enabled to easily and accurately adjust or change information while confirming the result and stability of detection indicated by the indicator 60.

Disposing the cable 70 at a tapered corner between the bottom wall 12 and the rear frame wall 13 makes it possible to use the entire area of the top wall 11 to install a large adjusting switch 50 and a large indicator 60 without restraining miniaturization of the photoelectric switch device 1A and also to provide the rear frame wall 13 with a large space available for disposing a large monitor display 30 and a large selecting/fixing/setting switch 40. Further, disposing the cable 70 at the tapered corner between the bottom wall 12 and the rear frame wall 13 keeps the optical head 20 from being blocked by the cable 70 even when the photoelectric switch device 1B is miniaturized.

Also in this embodiment, the photoelectric switch device 1B may be provided with a pair of a push button type adjusting switches 50 such as shown in FIGS. 1 and 2, a see-saw type adjusting switch 50 such as shown in FIG. 14, 15 or 16, a volume dial type adjusting switch 50 such as shown in FIG. 17, or a jog dial type adjusting switch 50 such as shown in FIG. 19 in place of the trimmer type adjusting switch 50 shown in FIG. 22. Otherwise, the adjusting switch may be of course replaced with various types of switches that are well known to those skilled in the art. Further, the photoelectric switch device 1B may be provided with a selecting/fixing/setting switch arrangement comprising a plurality of switches such as shown in FIG. 20 or a pair of independent switches such as shown in FIG. 21 in place of the selecting/fixing/setting switch 40.

Figure 23:
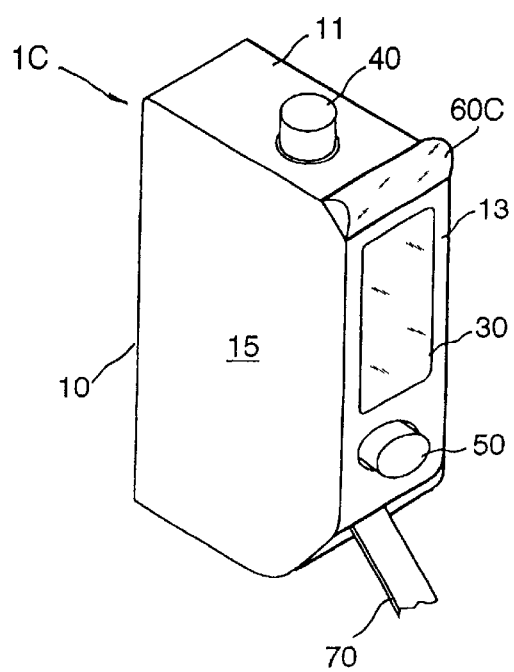
FIG. 23 is a rear perspective view of a triangulation type of photoelectric switch in accordance with still another preferred embodiment of the present invention.

FIG. 23 shows a triangulation type of photoelectric switch device 1C according to still another preferred embodiment of the invention. The photoelectric switch device 1C is approximately similar in construction to those of the previous embodiments but has an indicator 60C that is configured in a semi-cylindrical shape and disposed at a tapered rear top corner between a top wall 11 and a rear frame wall 13.

Figure 24:
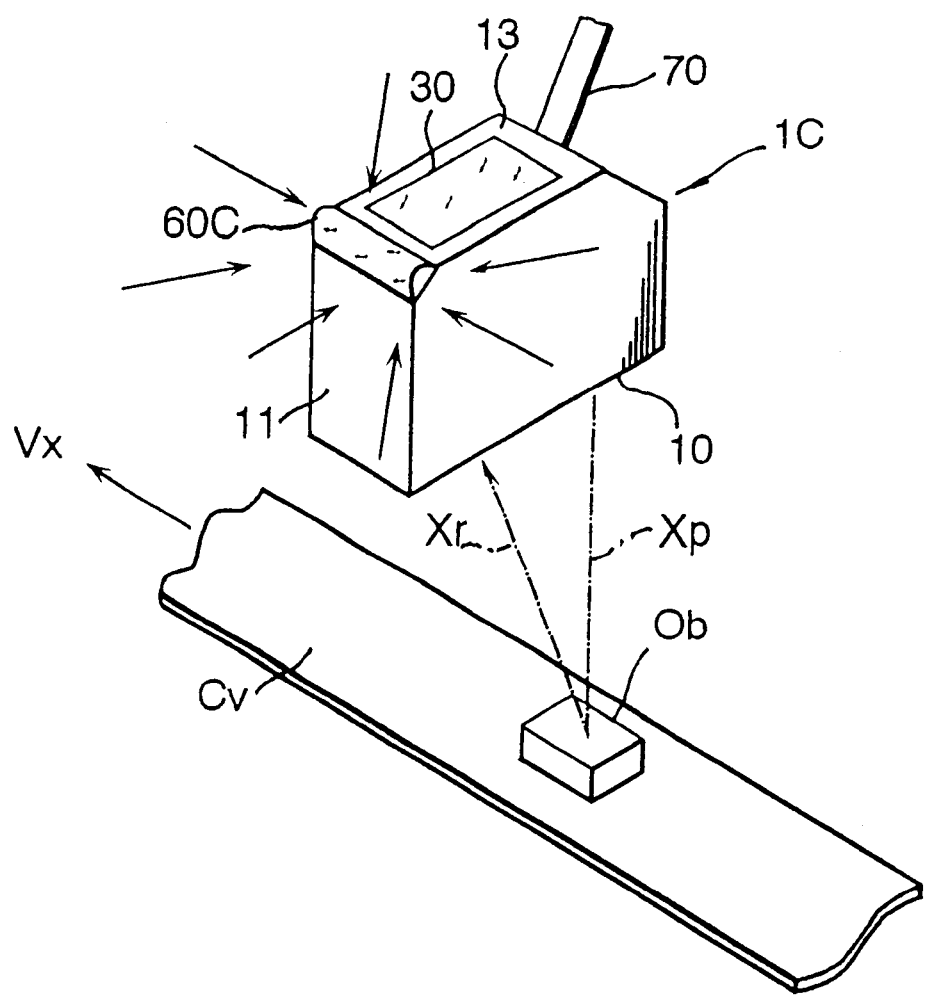
FIG. 24 is an explanatory perspective view showing the use of the triangulation type of photoelectric switch of FIG. 23.
Figure 25:
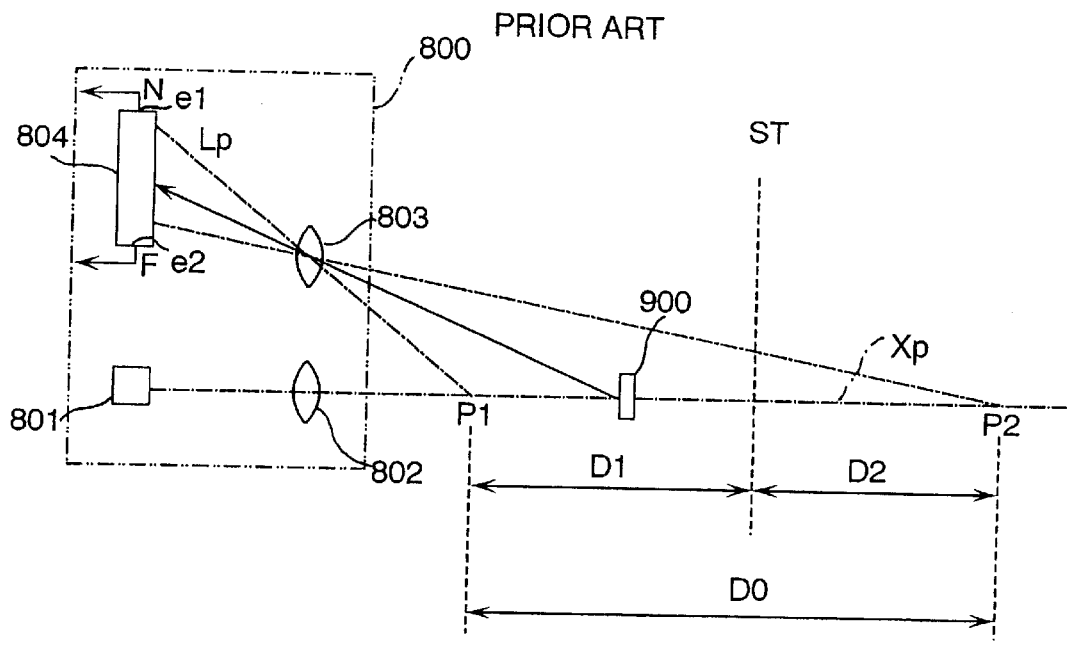
FIG. 25 is an explanatory illustration showing a principle of triangulation.

The photoelectric switch device 1C of this structure is desirable for ease of use as shown in FIG. 24. As shown in FIG. 24, the photoelectric switch device 1C is positioned above a belt conveyor Cv which transports an object 900 placed thereon in a direction Vx such that a plane including optical axces Xp and Xr of the projection lens and focusing lens of the optical head 20 is situated perpendicularly to both surface of the belt conveyor Cv an direction Vx of transportation. During object detection, the indicator 60C that is disposed at the tapered rear top corner between the top and rear walls 11 and 13 of the box casing 10 can be observed from above, front and both sides as indicate by the arrows. Accordingly, the photoelectric switch device 1C provides an increased visibility of the indicator 60C.

It is to be understood that while the present invention has been described in detail with regard to preferred embodiments, various other embodiments and variants may occur to those skilled in the art, which are, which are within the scope and spirit of the invention, and such other embodiments and variants are intended to be covered by the following claims.

What is claimed is:

1. A photoelectric switch device for detecting a presence or an absence of an object in a specified field of detection, which has at least a photoelectric means for receiving light from the field of detection and generating an electric signal of a level representing an amount of light received thereby and processing means for processing the electric signal from said photoelectric means, for making a determination of the presence or the absence of the object in the field of detection on the basis of a comparison of the level of the electric signal from said photoelectric means with a specified threshold and providing an electric signal representing a result of the determination, said photoelectric switch device comprising:

a generally rectangular-parallelepiped box casing defined by a plurality of walls in which said photoelectric means and said processing means are installed;

optical means disposed on a front wall of said generally rectangular-parallelepiped box casing for directing light from the field of detection to said photoelectric means;

display means disposed on a rear wall of said generally rectangular-parallelepiped box casing opposite to said front wall and operatively connected to said processing means for providing a display of at least one of the specified threshold and the level of the electronic signal from said photoelectric means;

adjusting means disposed on said rear wall and operatively connected to said processing means for selecting one of the specified threshold arid the level of the electronic signal from said photoelectric means to be displayed on said display means and adjusting the specified threshold while the specified threshold is displayed on said display means; and detection result indicator means disposed between said rear wall and a top wall of said generally rectangular-parallelepiped box casing connecting said top wall and said rear wall to each other and operatively connected to said processing means for indicating the result of the determination.

2. A photoelectric switch device as defined in claim 1, wherein said adjusting means changes a display on the display means to the specific threshold from the level of said electronic signal from said photoelectric means upon first operation of said adjusting means and makes a change in the specific threshold upon operation of said adjusting means subsequent to the first operation within a specified period of operation.

3. A photoelectric switch device as defined in claim 1, wherein said generally rectangular-parallelepiped box casing has an inclined corner wall between said rear wall and said top wall on which said detection result indicator means is disposed.

4. A photoelectric switch device as defined in claim 1, further comprising detection stability indicator means disposed between said rear wall and a top wall of said generally rectangular-parallelepiped box casing connecting said front wall and said rear wall to each other and operatively connected to said processing means for indicating stability of the determination.

5. A photoelectric switch device as defined in claim 4, wherein said generally rectangular-parallelepiped box casing has an inclined corner wall between said rear wall and said top wall on which said detection result indicator means and said detection stability indicator means are disposed.

6. A photoelectric switch device as defined in claim 1, further comprising a cable connected to said processing means and extending out from said generally rectangular-parallelepiped box casing between said rear wall and a bottom wall of said generally rectangular-parallelepiped box casing connecting said front and rear walls to each other for providing power to said sensor and signals including the electric signal representing the result of the determination at least from said switch.

7. A photoelectric switch device as defined in claim 6, wherein said generally rectangular-parallelepiped box casing has an inclined corner wall between said rear wall and said bottom wall through which said cable extends out from said generally rectangular-parallelepiped box casing.

8. A photoelectric switch device as defined in claim 1, wherein said adjusting means automatically selects the level of the electric signal from said photoelectric means for a display on said display means when said adjusting means remains unoperated for a specified period of time.

9. A photoelectric switch device as defined in claim 8, wherein said adjusting means changes a display on said display means to the specific threshold from the level of the electronic signal from said photoelectric means upon first operation of said adjusting means and makes a change on the specific threshold upon operation of said adjusting means subsequent to the first operation.

10. A photoelectric switch device as defined in claim 1, wherein the detection of an object is performed with a triangulation method.

11. A photoelectric switch device as defined in claim 1, further comprising a light emitting means for emitting light toward the object, said light emitting means being disposed on said front wall of said generally rectangular-parallelepiped box casing.

12. A photoelectric switch device for detecting a presence or an absence of an object in a specified field of detection, which has at least a photoelectric means for receiving light from the field of detection and generating an electric signal of a level representing an amount of light received thereby and processing means for processing the electric signal from said photoelectric means, for making a determination of the presence or the absence of the object in the field of detection on the basis of a comparison of the level of the electric signal from said photoelectric means with a specified threshold and providing an electric signal representing a result of the determination, said photoelectric switch device comprising:

a generally rectangular-parallelepiped box casing defined by a plurality of walls in which said photoelectric means and said processing means are installed;

optical means disposed on a front wall of said generally rectangular-parallelepiped box casing for directing light from the field of detection to said photoelectric means;

display means disposed on a rear wall of said generally rectangular-parallelepiped box casing opposite to said front wall and operatively connected to said processing means for providing a display of at least one of the specified threshold and the level of the electronic signal from said photoelectric means;

adjusting means disposed on said rear wall and operatively connected to said processing means for selecting one of the specified threshold and the level of the electronic signal from said photoelectric means to be displayed on said display means and adjusting the specified threshold while the specified threshold is displayed on said display means; and means for indicating a detection result disposed on said generally rectangular-parallelepiped box casing adjacent to a top wall and said rear wall and said means for indicating the detection result being operatively connected to said processing means for indicating the result of the determination.

13. A photoelectric switch device for detecting a presence or an absence of an object in a specified field of detection, which has at least a photoelectric means for receiving light from the field of detection and generating an electric signal of a level representing an amount of light received thereby and processing means for processing the electric signal from said photoelectric means, for making a determination of the presence or the absence of the object in the field of detection on the basis of a comparison of the level of the electric signal from said photoelectric means with a specified threshold and providing an electric signal representing a result of the determination, said photoelectric switch device comprising:

a generally rectangular-parallelepiped box casing defined by a plurality of walls in which said photoelectric means and said processing means are installed;

optical means disposed on a front wall of said generally rectangular-parallelepiped box casing for directing light from the field of detection to said photoelectric means;

display means disposed on a rear wall of said generally rectangular-parallelepiped box casing opposite to said front wall and operatively connected to said processing means for providing a display of at least one of the specified threshold and the level of the electronic signal from said photoelectric means;

adjusting means disposed on said rear wall and operatively connected to said processing means for selecting one of the specified threshold and the level of the electronic signal from said photoelectric means to be displayed on said display means and adjusting the specified threshold while the specified threshold is displayed on said display means; and means for indicating a detection result disposed on said generally rectangular-parallelepiped box casing in a location substantially between a top wall and said rear wall and said means for indicating the detection result being operatively connected to said processing means for indicating the result of the determination.

* * * * *